(12) United States Patent
Zhan et al.

(10) Patent No.: US 7,253,488 B2
(45) Date of Patent: Aug. 7, 2007

(54) PIEZO-TFT CANTILEVER MEMS

(75) Inventors: Changqing Zhan, Vancouver, WA (US); Michael Barrett Wolfson, Vancouver, WA (US); John W. Hartzell, Camas, WA (US)

(73) Assignee: Sharp Laboratories of America, Inc., Camas, WA (US)

( * ) Notice: Subject to any disclaimer, the term of this patent is extended or adjusted under 35 U.S.C. 154(b) by 193 days.

(21) Appl. No.: 11/031,320

(22) Filed: Jan. 5, 2005

(65) Prior Publication Data

US 2005/0130360 A1 Jun. 16, 2005

Related U.S. Application Data

(63) Continuation-in-part of application No. 10/131,318, filed on Apr. 23, 2002, and a continuation-in-part of application No. 10/131,006, filed on Apr. 23, 2002, and a continuation-in-part of application No. 10/131,057, filed on Apr. 23, 2002, now Pat. No. 6,860,939, and a continuation-in-part of application No. 10/131,549, filed on Apr. 23, 2002, and a continuation-in-part of application No. 10/131,808, filed on Apr. 23, 2002, and a continuation-in-part of application No. 10/131,551, filed on Apr. 23, 2002, now abandoned.

(51) Int. Cl.
*H01L 27/14* (2006.01)

(52) U.S. Cl. .................... 257/414; 257/415; 257/417; 257/418; 438/48; 438/50; 438/52

(58) Field of Classification Search ........ 257/414–417; 438/48–52
See application file for complete search history.

(56) References Cited

U.S. PATENT DOCUMENTS 3,582,690 A * 6/1971 Yerman ...................... 327/516
6,040,611 A * 3/2000 De Los Santos et al. ... 257/415
6,630,367 B1 * 10/2003 Kubena et al. ............... 438/48

OTHER PUBLICATIONS

Vinayak P Dravid and Gajendra S Shekhawat; "MOSFET Integrated Microcantilevers for Novel Electronic Detection of "On-Chip" Molecular Interactions", Material Science, Northwestern University, Evanston, Illinois, Apr. 14, 2004.
Joao Gaspar, Haohua Li, Paulo Peieiro Freitas, "Integrated Magnetic Sensing of Electro-statically Actuated Thin-Film Microbridges", Journal of MicroElectroMechanical Systems, vol. 12, No. 5, Oct. 2003, p. 550-556.

* cited by examiner

*Primary Examiner*—Dung A. Le
(74) *Attorney, Agent, or Firm*—Law Office of Gerald Maliszewski; Gerald Maliszewski

(57) ABSTRACT

A piezo-TFT cantilever microelectromechanical system (MEMS) and associated fabrication processes are provided. The method comprises: providing a substrate, such as glass for example; forming thin-films overlying the substrate; forming a thin-film cantilever beam; and simultaneously forming a TFT within the cantilever beam. The TFT is can be formed least partially overlying a cantilever beam top surface, at least partially overlying a cantilever beam bottom surface, or embedded within the cantilever beam. In one example, forming thin-films on the substrate includes: selectively forming a first layer with a first stress level; selectively forming a first active Si region overlying the first layer; and selectively forming a second layer overlying the first layer with a second stress level. The thin-film cantilever beam is formed from the first and second layers, while the TFT source/drain (S/D) and channel regions are formed from the first active Si region.

11 Claims, 12 Drawing Sheets

$$f_0 = \frac{K_1}{2\pi}\sqrt{\frac{E_Y \cdot g \cdot t^3}{12(1-V) \cdot a^4 \, p_{ac}}}$$

Fig. 17

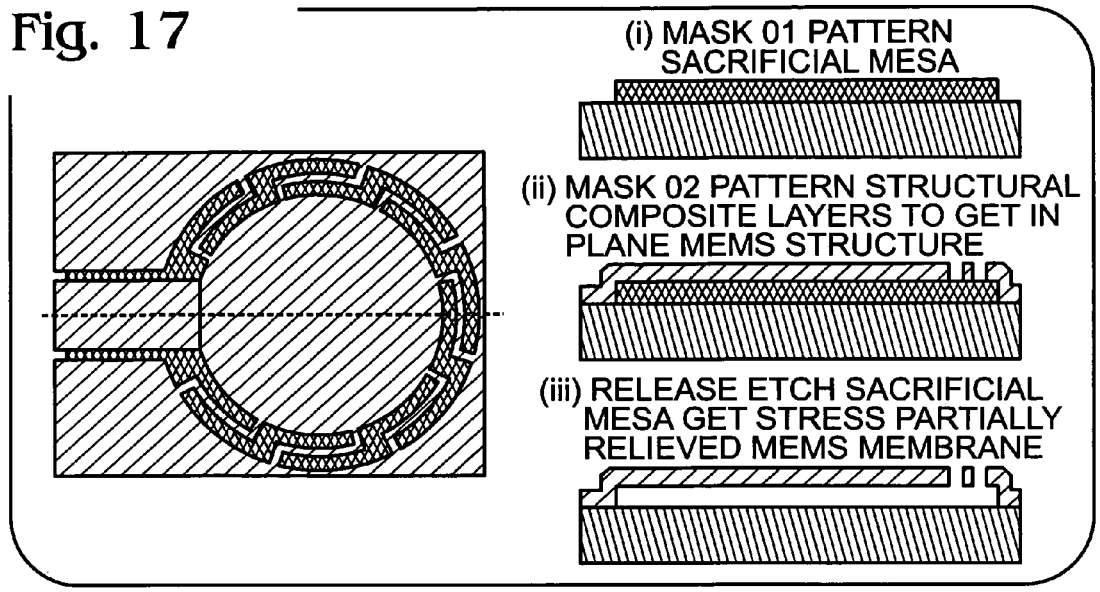

(i) MASK 01 PATTERN SACRIFICIAL MESA (ii) MASK 02 PATTERN STRUCTURAL COMPOSITE LAYERS TO GET IN PLANE MEMS STRUCTURE (iii) RELEASE ETCH SACRIFICIAL MESA GET STRESS PARTIALLY RELIEVED MEMS MEMBRANE

Fig. 18

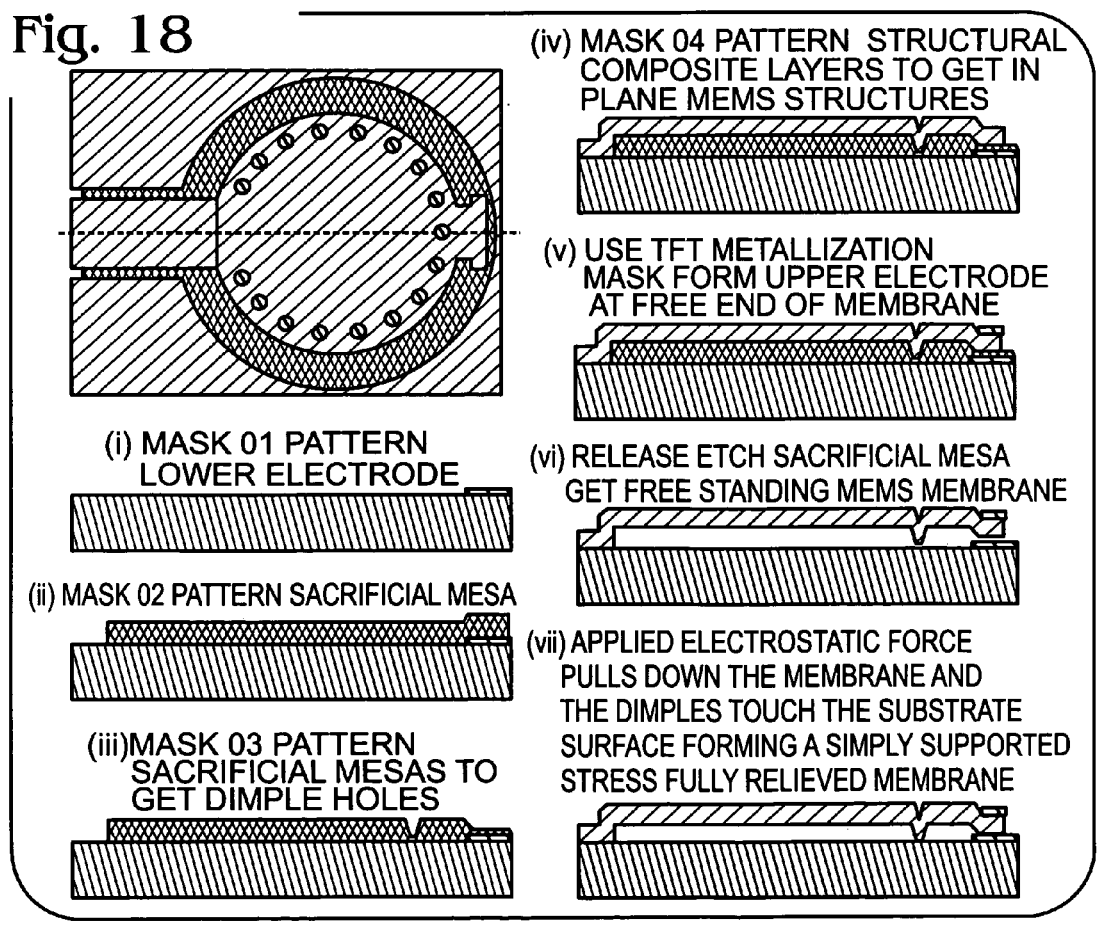

(i) MASK 01 PATTERN LOWER ELECTRODE (ii) MASK 02 PATTERN SACRIFICIAL MESA (iii) MASK 03 PATTERN SACRIFICIAL MESAS TO GET DIMPLE HOLES (iv) MASK 04 PATTERN STRUCTURAL COMPOSITE LAYERS TO GET IN PLANE MEMS STRUCTURES (v) USE TFT METALLIZATION MASK FORM UPPER ELECTRODE AT FREE END OF MEMBRANE (vi) RELEASE ETCH SACRIFICIAL MESA GET FREE STANDING MEMS MEMBRANE (vii) APPLIED ELECTROSTATIC FORCE PULLS DOWN THE MEMBRANE AND THE DIMPLES TOUCH THE SUBSTRATE SURFACE FORMING A SIMPLY SUPPORTED STRESS FULLY RELIEVED MEMBRANE

… (US 7,253,488 B2)

PIEZO-TFT CANTILEVER MEMS

RELATED APPLICATIONS

This application is a continuation-in-part of a pending patent application entitled, CRYSTAL-STRUCTURE-PROCESSED MECHANICAL DEVICES AND METHODS AND SYSTEMS FOR MAKING, invented by John Hartzell, Ser. No. 10/131,318, filed Apr. 23, 2002.

This application is a continuation-in-part of a pending patent application entitled, THIN-FILM CRYSTAL-STRUCTURE-PROCESSED DEVICES AND METHODS AND SYSTEMS FOR MAKING, invented by John Hartzell, Ser. No. 10/131,006, filed Apr. 23, 2002.

This application is a continuation-in-part of a patent application entitled, SEMICONDUCTOR CRYSTAL-STRUCTURE-PROCESSED MECHANICAL, AND METHODS AND SYSTEMS FOR MAKING, invented by John Hartzell, Ser. No. 10/131,057, filed Apr. 23, 2002, now U.S. Pat. No. 6,860,939.

This application is a continuation-in-part of a pending patent application entitled, MONOLITHIC INTEGRATED CRYSTAL-STRUCTURE-PROCESSED MECHANICAL, AND COMBINED MECHANICAL AND ELECTRICAL DEVICES, AND METHODS AND SYSTEMS FOR MAKING, invented by John Hartzell, Ser. No. 10/131,549, filed Apr. 23, 2002.

This application is a continuation-in-part of a pending patent application entitled, MONOLITHIC STACKED/LAYERED CRYSTAL-STRUCTURE-PROCESSED MECHANICAL, AND COMBINED SYSTEMS FOR MAKING, invented by John Hartzell, Ser. No. 10/131,808, filed Apr. 23, 2002.

This application is a continuation-in-part of a abandoned patent application entitled, FORMATION OF CRYSTAL-STRUCTURE-PROCESSED MECHANICAL, AND COMBINED MECHANICAL AND ELECTRICAL DEVICES ON LOW-TEMPERATURE SUBSTRATES, invented by John Hartzell, Ser. No. 10/131,551, filed Apr. 23, 2002.

The six above-mentioned applications are incorporated herein by reference.

BACKGROUND OF THE INVENTION

1. Field of the Invention

This invention generally relates to the fabrication of microelectromechanical systems (MEMS) and, more particularly, to a cantilever thin-film transistor (TFT) MEMS and related fabrication procedures.

2. Description of the Related Art

TFTs are formed through deposition processes that create thin films of silicon (Si) and insulator material. While the resulting TFTs may not have the switching speed and drive capability of transistors formed on single-crystal substrates, the transistors can be fabricated cheaply with a relatively few number of process steps. Further, thin-film deposition processes permit TFT devices to be formed on alternate substrate materials, such as transparent glass substrates, for use in liquid crystal displays (LCDs). More specifically, the TFTs include a deposited amorphous Si (a-Si) layer. To improve the performance of the TFT, the a-Si may be crystallized to form poly-silicon, at the cost of some extra processing. The crystallization procedures are also limited by the temperature sensitivity of the substrate material. For example, glass substrates are known to degrade at temperatures over 650 degrees C. Large scaled devices, integrated circuits, and panel displays are conventionally made using thin-film deposition processes.

MEMS devices are a logical derivative of semiconductor IC processes that may be used to develop micrometer scale structural devices such as transducers or actuators. MEMS devices interface physical variables and electronic signal circuits. MEMS structures are varied and, therefore, more difficult to standardize, as compared to the above-mentioned thin film processes. On the other hand, it may be possible to develop MEMS devices by engineering modifications to well-developed silicon IC processes. Many of the MEMS devices that have been fabricated to date have more theoretical than practical application, as the devices are often difficult and expensive to make. For the same reason, larger scale systems using MEMS components, have been expensive to fabricate due to the process difficulties and the cost associated with integrating the MEMS and IC technologies. For example, transistors and associated MEMS structures have been fabricated on bulk Si substrates, and the authors claim excellent performing biochemical sensing MEMS transducers [Vinayak P Dravid and Gajendra S Shekhawat; "MOSFET Integrated Microcantilevers for Novel Electronic Detection of "On-Chip" Molecular Interactions", Material Science, Northwestern University, Evanston, Ill.]. However, the etching processes needed to form a bulk silicon MEMS are more difficult to control, dramatically limit available process steps, and require long etch times. These limitations make these devices unsuitable for low-cost integrated systems. Alternately, MEMS structures made using high temperature LPCVD thin films have been built with conventional sensing schemes such as capacitive and/or piezoresistive bridges, generating reasonable output signals [(1)William P. Eaton, James H. Smith, David J. Monk, Gary O'Brien, and Todd F. Miller, "Comparison of Bulk- and Surface-Micromachined Pressure Sensors", *Micromahined Devices and Components, Proc. SPIE*, Vol. 3514, P. 431. (2)Joao Gaspar, Haohua Li, Paulo Peieiro Freitas, "Integrated Magnetic Sensing of Electro-statically Actuated Thin-Film Microbridges", Journal of MicroElectroMechanical Systems, Vol. 12, No. 5, October 2003, p.550-556]. However, these sensing schemes cannot be applied to low temperature TFT process, because the changes in electrical characteristics induced as a result of stress change are too small to be practically measured.

It would be advantageous if active devices could be formed in a MEMS mechanical structure using the same, shared process steps.

It would be advantageous if a TFT could be integrated with a MEMS mechanical structure using the same, shared thin-film deposition and annealing processes.

It would be advantageous if a stress change sensing scheme could be formed in a MEMS mechanical structure using the same, shared process steps as TFT fabrication.

SUMMARY OF THE INVENTION

The present invention fabrication method is applicable to a variety of explicit types of thin film MEMS devices. To illustrate the invention, an example of a piezo-TFT cantilever MEMS is presented. However, it should be understood that the invention has broader application.

Accordingly, a method is provided for fabricating a piezo-TFT cantilever microelectromechanical system (MEMS). The method comprises: providing a substrate, such as glass for example; forming thin-films overlying the substrate; forming a thin-film cantilever beam; and simultaneously forming a TFT within the cantilever beam. The TFT can be formed least partially formed overlying a cantilever beam top surface, at least partially formed overlying a cantilever beam bottom surface, or embedded within the cantilever beam. Some examples of thin-films that can be used include amorphous silicon (a-Si), polycrystalline Si (poly-Si), oxides, a-SiGe, poly-SiGe, metals, metal-containing compounds, nitrides, polymers, ceramic films, magnetic films, and compound semiconductor materials.

More specifically, forming thin-films on the substrate includes: selectively forming a first layer with a first stress level; selectively forming a first active Si region overlying the first layer; and selectively forming a second layer overlying the first layer with a second stress level. The thin-film cantilever beam is formed from the first and second layers, while the TFT source/drain (S/D) and channel regions are formed from the first active Si region. In some aspects, the first active Si region and the second layer are formed in the same Si deposition process (both layer are Si). Then, the active Si region of the cantilever TFT and the cantilever beam second layer can be laser annealed. The first active Si region can be on a different layer, and in some aspects, the first active Si region can be merged to either the first layer or the second layer by partially annealing selected regions when either the first layer or the second layer is a Si film. Note, even if annealed in the same step, the two annealing processes need not be identical. For example, the fluence or the time during annealing in the Si active region may be different than for the cantilever second layer. Thus, the step of simultaneously forming the TFT within the cantilever may include: creating an electrical characteristic in the active Si region in response to the laser annealing; and creating a mechanical characteristic in the second layer in response to the laser annealing.

In another aspect, a sacrificial layer is formed overlying the substrate from a material such as AlN. Then, forming the thin-film cantilever beam includes: selectively etching the first and second layers, exposing the sacrificial layer; undercut etching the sacrificial layer; and forming a cavity between the first layer and the insulator.

Additional details of the above-described method and an associated piezo-TFT cantilever MEMS are provided below.

BRIEF DESCRIPTION OF THE DRAWINGS

FIGS. 17 and 18 depict a 2-mask and 4-mask method, respectively, for fabricating a membrane.

DETAILED DESCRIPTION

Figure 1:
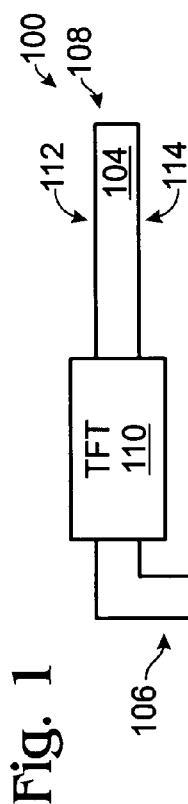
FIG. 1 is a partial cross-sectional view of a piezo thin-film transistor (piezo-TFT) cantilever microelectromechanical system (MEMS).

FIG. 1 is a partial cross-sectional view of a piezo thin-film transistor (piezo-TFT) cantilever microelectromechanical system (MEMS). The piezo-TFT cantilever 100 comprises a substrate 102, made from a material such as glass, polymer, quartz, metal foil, Si, sapphire, ceramic, or compound semiconductor materials. A thin-film cantilever beam 104 has a distal end 106, anchored to the substrate 102, and a proximal end 108. Note, in other aspects not shown both the distal end and the proximal end can be anchored to substrate. Also, the shape of the cantilever body can be a simple beam shape, any membrane shape, or combinations of beam shapes and membrane shapes, with one or multiple anchors to the substrate. A TFT 110 is shown within the cantilever beam 104. The cantilever beam 104 and TFT 110 are made from materials such as a-Si, poly-Si, oxides, a-SiGe, poly-SiGe, metals, metal-containing compounds, nitrides, polymers, ceramic films, magnetic films, or compound semiconductor materials. The above-mentioned lists are not intended to be an exhaustive list of every possible material, but rather some examples of conventional thin-film materials that can be used.

The cantilever beam 104 has a top surface 112 and a bottom surface 114. As used herein, the phrase "a TFT within the cantilever beam" means that the cantilever TFT 110 has a location at least partially on the cantilever beam top surface 112, at least partially on the cantilever beam bottom surface 114, or embedded within the cantilever beam 104.

Figure 2:
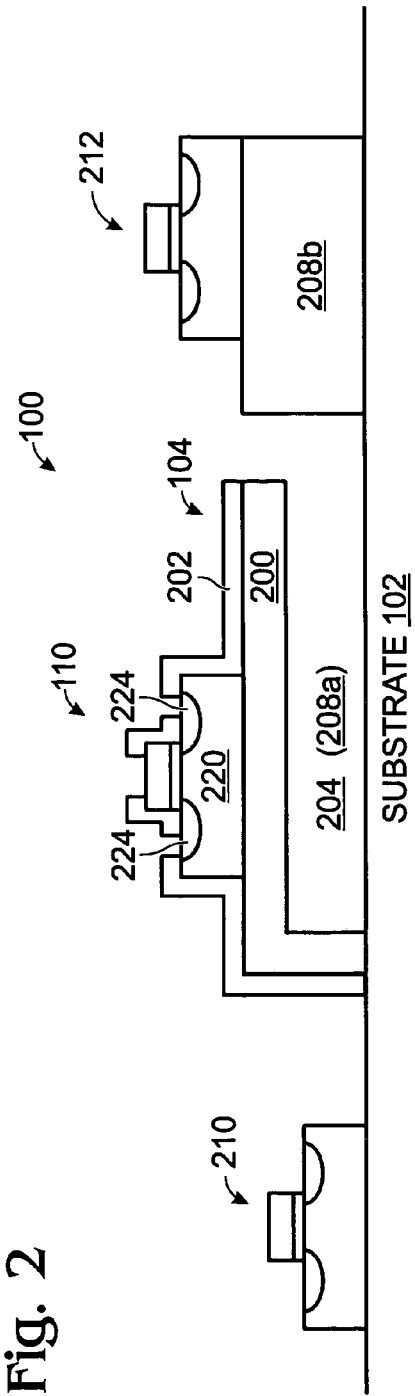
FIG. 2 is a partial cross-sectional view of the piezo-TFT cantilever of FIG. 1, with the cantilever TFT located on the cantilever top surface.

FIG. 2 is a partial cross-sectional view of the piezo-TFT cantilever 100 of FIG. 1, with the cantilever TFT 110 located on the cantilever top surface 112. In one aspect, the cantilever beam 104 includes a first thin-film layer 200 with a first stress level and a second thin-film layer 202 with a second stress level overlying the first layer. As shown in FIG. 2, the first and second layers 200/202 are a Si oxide material. Other likely materials include Si and Si nitride.

In some aspects, a temporary sacrificial layer 208 overlies the substrate 102. A cavity 204 is formed between the first layer 200 and the substrate 102 in response to removing the temporary sacrificial layer. The temporary sacrificial layer can be a material such as AlN, Si, SiGe, polymers, dielectrics, Al, or ceramics.

The differences in stress between the first layer 200 and the second layer 202 are managed to ensure that the cantilever bends "up", so that it does not bend down and stick to the substrate. These built-in stresses act upon the cantilever TFT active Si regions and result in electron mobility enhancement. This mobility enhancement is reflected in the TFT static characteristics, making the TFT more sensitive to any longitudinal strain change caused by external forces, temperatures, chemical reactions and the like, acting upon the cantilever beam 104. In other words, the built-in stress of the cantilever helps to enhance the static characteristics of cantilever TFT via straining the active Si region to enhance the electron mobility. Any longitudinal strain change caused by external forces, temperatures, chemical reactions and the like, acting upon the cantilever beam 104 results in additional electron mobility changes, on top of the static electron mobility induced by the built-in stress. In this manner, the stress change acting upon the active Si region can be determined as a result of measuring changes in TFT characteristics. The cantilever with TFT converts external physical variables such as forces, velocities, accelerations, rotations, temperature changes, surface tension changes, photon input, and the like, to electrical signals.

Thus, the cantilever TFT 110 may be considered a cantilever strain-sensing TFT. More specifically, the cantilever TFT 110 senses changes in strain. In one aspect, the piezo-TFT cantilever 100 may further comprise a strain-reference TFT 210 overlying the substrate 102 and adjacent the cantilever beam 104. For example, the electrical characteristics of the reference TFT 210 may be compared to the strain-sensing TFT 110 in order to determine the degree of stress change present on the cantilever beam 104. For example, the strain-sensing TFT 110 and strain-reference TFT 210 may be a CMOS transistor pair, or part of a MOS circuit.

In a different aspect, the sacrificial layer that overlies the substrate 102 comprises a temporary region 208a that is etched away, and a permanent region 208b (that is not etched). A strain-reference TFT 212 overlies the permanent region of sacrificial layer 208b. This method of fabrication may permit the strain-reference TFT 212 to act as a better reference, as the underlying layers of the two TFTs are more similar.

The cantilever TFT 110 includes a channel region 220 and source/drain regions 222 formed in an active Si region 224. In some aspects, the TFT active Si region 224 and the cantilever beam 104 may both include laser annealed materials. Thus, the Si active region 224 may be annealed to alter electrical characteristics by controlling the grain sizes. In some aspects, the first active Si region can be merged to either the first layer or the second layer by partially annealing selected regions when either the first layer or the second layer is a Si film. By selectively annealing the active regions and non-active cantilever regions, desired electrical and mechanical characteristics on different regions can be managed in the same process step by programming the laser anneal system. Even if the cantilever is made from Si oxide, as in the present example, the oxide layers 200 and 202 may be laser annealed, in the same or different process steps than the annealing of the Si active layer 224, to alter mechanical characteristics of the beam 104. The second layer 202 is selectively etched away over the source, drain, and gate regions of TFT 110, as might be done if interlevel interconnects were to be formed to overlying circuitry. Details of laser annealing processes have been provided in the incorporated related applications. It should be understood that the piezo-TFT cantilever fabrication may be enabled using an convention annealing or laser annealing procedure.

Figure 3:
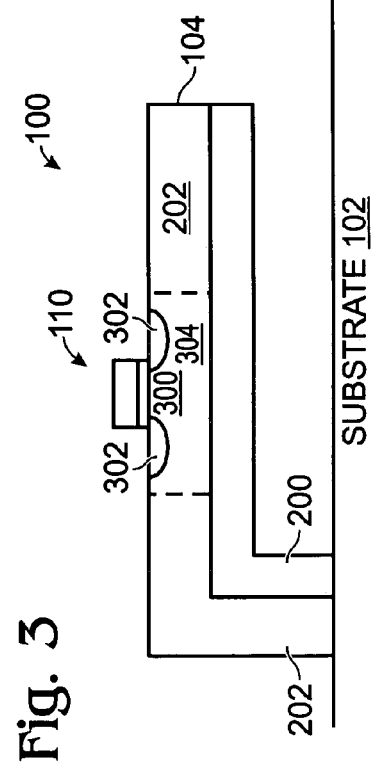
FIG. 3 is a partial cross-sectional view of a variation of the piezo-TFT cantilever of FIG. 2.

FIG. 3 is a partial cross-sectional view of a variation of the piezo-TFT cantilever 100 of FIG. 2. As shown, the cantilever TFT 110 includes a channel region 300 and source/drain regions 302 formed in an active Si region 304 (defined with layer 202 with dotted lines). The TFT active Si region 304 is part of a cantilever beam Si layer. As shown, active Si region 304 is a portion of the second layer 202. Thus, in this example, the second layer 202 is Si. The active Si region 304 and second layer may both undergo laser annealing processes. The annealing may occur is the same or separate annealing processes. Even if annealed in the same process step, the two regions may be subject to different fluences, time durations, or number of laser shots. In this manner, the grain size in the active region 304 can selectively be made larger than in the Si second layer 202. Also, this laser annealing process permits the mechanical characteristics of the second layer 202 (or first layer 200) to be altered independent of the rest of the materials on the substrate. Additional details and variations of the piezo-TFT cantilever of FIGS. 1-3 are presented below.

Functional Description

As part of an on-going MEMS effort, it has been necessary to develop new fabrication processes and to set up new measurement and metrology tools. While the MEMS processes use the same types of films as TFT fabrication, these films and the methods of etching and analyzing them require additional considerations. In particular, the mechanical properties of thin-films are often ignored by engineers who conventionally only work with transistors. New film processes must be developed to support mechanical applications.

Just as solid-state device designers first focus on the electrical properties of any new film before attempting to build active devices using that material (such as low-K dielectrics or copper interconnects) MEMS designers must first focus on the mechanical properties of the films before constructing devices. The most important properties are the film stress, stress gradient (e.g. how much the stress varies from the top of the film to the bottom of the film), stiffness, and behavior in various etchants since at least one material is sacrificed to form a cavity, while other films survive.

Film Stress and Stress Gradient

Two aspects of film quality that must be considered are the stress and stress gradient. These film properties are often ignored by those familiar with bulk and thin-film transistor development, yet they are vitally important to any surface micromachined structure. Typically, when thin-films adhere to each other, no more thought is given to their mechanical properties. When these thin-films are freed of their constraints and are used as structural elements, stress and stress gradient must be taken into account. The thickness of sacrificial film, usually a couple of microns, defines the travel displacement of a MEMS structure. This is typically at least an order of magnitude smaller than the lateral dimensions of the MEMS structure. If the structure is not stress free or gradient free, then it may simply bend down and touch the substrate or other structures. The structure will therefore not function as designed.

Highest yields occur when structures, such as cantilevers, are flat after release, or slightly bent upwards (away from the substrate). The effects of high tensile stress can be catastrophic—the film cracks at the weakest point (typically the anchors), or buckles into an undesirable shape. Most SiO2 deposition recipes, if not optimized, typically have a moderate amount of compressive stress. Amorphous silicon also tends to be compressive, but most sputtered metals are tensile. A film with no average stress may still have a gradient. That is, the top of the film may be compressive and the bottom may be tensile yet the sum of the two stresses is still zero. This gradient must also be zeroed out, or it may induce yet another failure mode into the mechanical system.

The stress in a film and stack of films can easily be determined by measuring the radius of curvature of the film and substrate stack. This technique can be applied to measure the stress gradient in a film stack via measuring its curvature.

Adjusting the Stress and Stress Gradient

Figure 5:
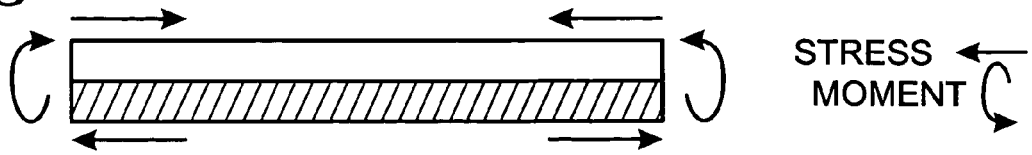
FIG. 5 is a diagram depicting an induced negative stress gradient in a film stack.

FIG. 5 is a diagram depicting an induced negative stress gradient in a film stack. A stress gradient can be induced by depositing a composite structure, where half of the film has one stress and the other half another stress. This structure provides an additional variable to counteract the effects of the inherent stress gradient. If a single film has a downward (positive) stress gradient, a compressive film is deposited below a tensile film, with the same inherent stress gradient, but only half thickness. The stress level difference between these two half thickness films tends to cause the composite to bend upwards (negative gradient), as in the figure. By balancing the induced negative gradient with the inherent positive gradient, a flat stress-free, stress gradient-free film can be formed.

Figure 6:
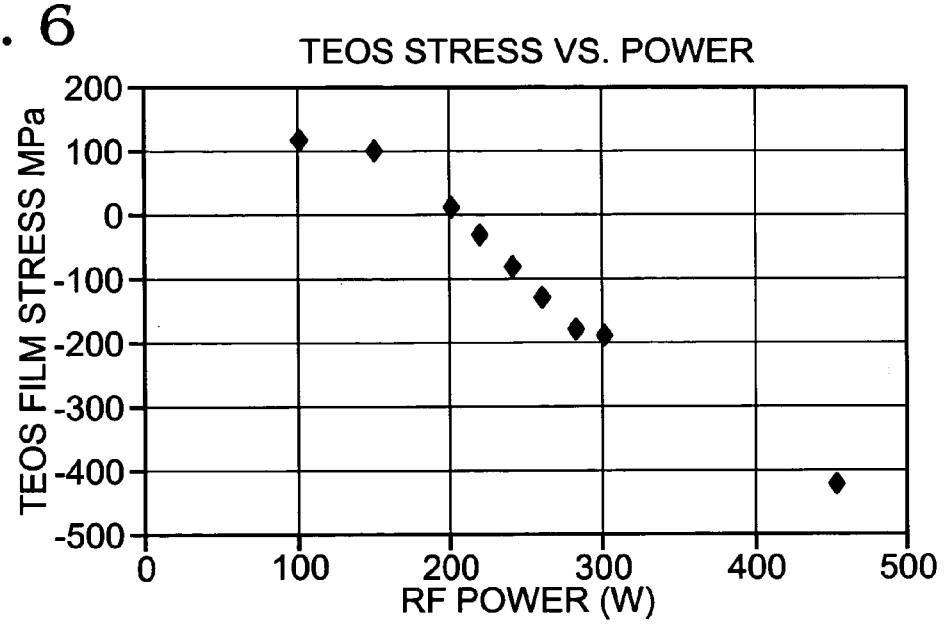
FIG. 6 depicts a graph of film stress vs. RF power.

FIG. 6 depicts a graph of film stress vs. RF power. One variable that can be used to adjust the film stress of a TEOS-based oxide film is the RF power during deposition. In the case of the TEOS-based SiO2, reducing the power of the RF source when depositing the film provides a dramatic change in film stress. One recipe with good electrical properties runs at 450 W, producing a film with about −420 Mega Pascal (MPa). By modifying the RF power, the stress can be varied from compressive to tensile. The convention is that negative stress is compressive and positive stress is tensile. Depositing the TEOS at about 200 W produces a film with no stress.

Sacrificial Film Development

To realize even the simplest MEMS structure, two layers of films are often required. One is the structural layer, which forms the final moving MEMS device, and another is the sacrificial layer. The sacrificial layer defines the air gap between the released MEMS structure and the substrate, providing the space for it to travel the specified displacement.

The general requirements for sacrificial film are:

1. Sacrificial films should have small thermal expansion coefficient mismatch relative to the corresponding structural film, so that during the structural film deposition and later thermal treatments, very little thermal stress will be introduced to the structural film.

2. Sacrificial films need to be chemically stable: no melting, gassing, decomposition, or alloying with structural film can happen, especially during thermal treatments.

3. Sacrificial films should not be a contamination source for a CMOS cleanroom. This is extremely important for integration of MEMS devices with MOS or TFTs.

4. Sacrificial films should be patternable using standard dry etch or wet etch methods with photolithography photoresist masks.

5. Sacrificial films should be etched using a chemical process which leaves the structural films unmodified, or with a very high etch rate selectivity.

All these requirements limit the available structural film/ sacrificial film/release etchant combinations. Some successfully developed structural-sacrificial-etchant combinations are polysilicon (or amorphous silicon)/SiO2/HF, metal/photoresist/oxygen plasma, SiO2 (or SiN)/photoresist(or polyimide)/oxygen plasma.

Two sets of films/etchant combinations have been developed. One is using amorphous silicon as structural film, SiO2 as sacrificial film, and HF as releasing etchant. Another is using TEOS SiO2 as structural film, AlN as sacrificial film and NH4OH (or TMAH) as an etchant.

In the case of a MEMS microphone, the existing TEOS films in the TFT flow can be used as the MEMS structural film, and AlN as the sacrificial film. The final step of MEMS microphone processing is to etch away the AlN sacrificial film. This occurs after all of the other film deposition, patterning, and etch steps have been completed. Otherwise, the microphone membrane can be damaged by improper handling (e.g. mechanical shock) and the AlN might contaminate the active channel or gate oxide.

Depositing AlN simply involves a reactive sputter step, where nitrogen is injected and reacts with the aluminum target in the reactive sputter system. AlN is then sputtered from the target onto the wafer. Another point worth keeping in mind is the "stiction" effect. When drying the wafer after a wet release step, the surface tension of the drying fluid can cause very strong capillary forces. These capillary forces often pull compliant devices down to the substrate, where they stick (from covalent or hydrogen bonds) dropping the yield. Various techniques can be used to reduce the effects of stiction, including using stiffer structural elements, supercritical drying, or hydrophobic monolayer coatings.

The AlN film is deposited on the substrate at low temperature (200 C.) using the reactive sputtering system. AlN films can be deposited from 1000 A to 5000 A thick, at stress lower than 300 MPa, with reasonable uniformity. In one wet etch experiment, ammonium hydroxide solution (28%-30%) was used to strip AlN film at room temperature. A 1000 A thick AlN film was etched away in 50 minutes, thus the etch rate is 20 A/min. To increase the etch rate, the 28%-30% ammonium hydroxide solution is heated, and the etch rate increases dramatically. At 65 C., the etch rate is 3325 A/min, which is about 175 fold as high as the rate at 15 C.

Table 2.3 summarizes the stress measurement results of AlN film on several test wafers with different thicknesses. Generally, the stress level of our AlN film is low, meaning that this kind of AlN film can be deposited up to several microns thick, permitting MEMS structures to be formed with various air gap heights.

TABLE 2.3

| Wafer ID | AlN thickness (A) | AlN stress (MPa) | Stress direction |
| --- | --- | --- | --- |
| LCD-AlN-02 | 1000 | 134.7 | Tensile |
| MC003-03 | 5000 | 76.48 | Tensile |
| MC003-04 | 5000 | 53.62 | Tensile |
| MC003-21 | 5000 | 202.1 | Tensile |
| MC003-22 | 5000 | 298.0 | Tensile |
| MC003-23 | 5000 | 175.4 | Tensile |

AlN films can be patterned using standard lithography and RIE etch. AlN films can be wet etched. AlN film does not change its properties when annealed at 650 C. This permits glass substrate surface micromachining techniques to be compatible with the existing TFT processes. In addition to AlN, aluminum and a-Si can be used as a sacrificial material.

Step Coverage

The step coverage of structural films is of vital importance, since this is what anchors it to the substrate. Mechanical systems tend to break at their weakest point. If the step coverage of a structural film is poor, then the film is thinner, and thus weaker, at this point. In general, TEOS-based SiO2 films tend to have excellent conformality. The width of the step coverage can be made 0.766 um with 1 um thick TEOS SiO2 films. This is sufficient to construct a sturdy mechanical anchor. TiN films also have sufficient step coverage over the TEOS step.

Preliminary MEMS Device Operation & Analysis

Figure 7:
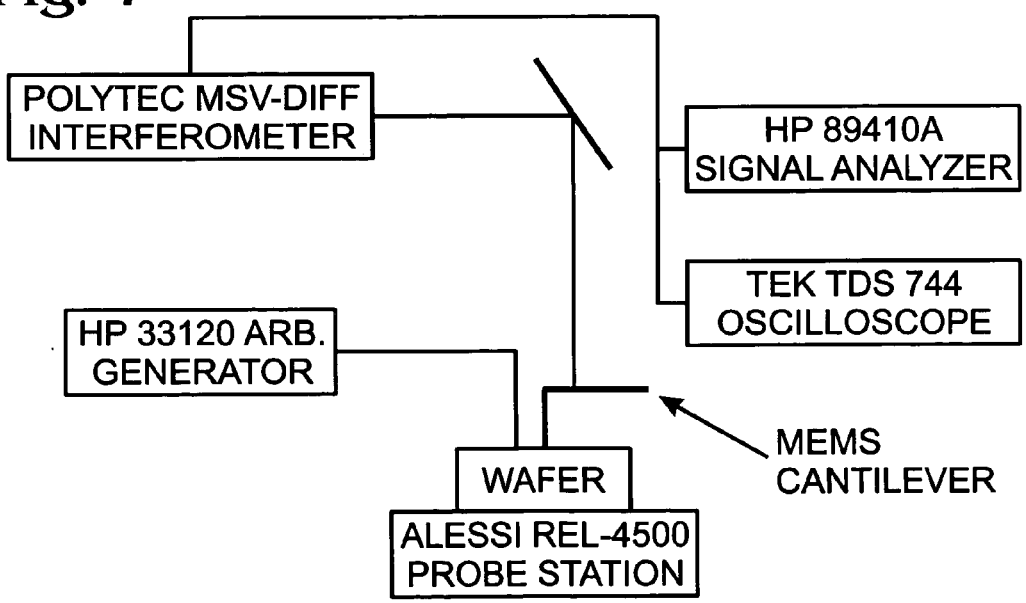
FIG. 7 is a diagram depicting a piezo-TFT MEMS test set-up.

FIG. 7 is a diagram depicting a piezo-TFT MEMS test set-up. An HP 33120 is used to supply a sinusoidal or square wave input to the probe on the probe station. This probe is connected to probe pads on a wafer with actuatable MEMS cantilevers. This causes the MEMS to move. The Polytec MSV-DIFF interferometric system measures the displacement of the cantilever and outputs a voltage proportional to that displacement. This voltage is monitored by an HP 89410A signal analyzer and Tektronix TDS 744 oscilloscope. The signal analyzer and oscilloscope capture this data and display the displacement in time (oscilloscope) and frequency (signal analyzer).

The distance between the bottom of the transparent TEOS membrane and the top of the reflective substrate produces optical interference at certain distances. This optical property produces constructive and destructive interference, which appears as light and dark bands of fringes. These optical properties provide another means of evaluating MEMS behavior.

The pattern of fringes indicates how the gap changes along the length of the cantilever. When the fringes are spaced closely together, this shows a rapid change of spacing, and distantly spaced (or nonexistent) fringes show very slow change of spacing. The final image shows that the right half of the cantilever has no fringes—this means that the cantilever is flat relative to the substrate (in this case, it is resting directly on the substrate).

Integration of MEMS with TFT

There are two general categories of MEMS processes—bulk micromachining and surface micromachining. Bulk micromachining uses a subtractive process to carve the MEMS structure out of the bulk substrate (typically a silicon wafer). Surface micromachining fabricates the MEMS device using an additive process wherein successive layers of sacrificial layers and thin-films are deposited on top of an unetched substrate. Surface micromachined devices can be fabricated on any substrate compatible with thin-film processing.

MEMS on Glass

The use of glass substrates offers unique opportunities to produce surface micromachined devices with low temperature processes at a much lower cost.

TABLE 3.1

Comparison of Silicon vs. Glass substrates

| Attribute | Silicon substrate | Glass substrate |
|---|---|---|
| Cost | moderate | low |
| Max substrate size (m$^2$) | 1 | >2.7 |
| Optical properties | Transparent to IR | Transparent to all wavelengths |
| Electrical insulation | poor | excellent |
| Dielectric properties | poor | excellent |
| Biological compatibility | poor | excellent |
| Thermal insulation | poor | excellent |
| Max temperature | 1400 C. | 650 C. |
| Crystallographic bulk etch | yes | no |

The optical transparency of glass (other than its obvious advantage for displays) permits the creation of novel MEMS devices. For example, it is possible to optically sense the motion of a device through the substrate without requiring through-holes or expensive packaging. MEMS devices can be built on the same substrate as LC displays. This provides opportunities to build other novel devices including a compact ultrasound transducer integrated onto the same substrate as an LCD allowing for easy medical examination, a low-cost glucose monitor with integrated LCD readout for diabetics, and a wide variety of other sensor+display elements. One of the stumbling blocks when developing RF and electromagnetic MEMS devices is the effect of the silicon substrate. Typically, large quantities of substrate must be removed to improve the quality of the MEMS device. By using a glass substrate, this process is not necessary and the devices are simpler to manufacture and are more physically robust (since the substrate is intact). Additionally, many MEMS processes need to take special steps to electrically isolate individual moving elements from each other when they're all attached to the same conductive and parasitic substrate. Again, with glass, this isolation is inherently not necessary.

Microfluidic and biological applications often require materials that are bio-compatible, i.e. are biologically inert. Glass is one such material. It is simpler to start with a bio-compatible material (such as a glass substrate) than to use incompatible materials and coat them with appropriate surfaces.

Quite a few MEMS applications require thermal insulation between elements, such as bio-meters (IR sensors), field emission tips, and chemical detectors. With devices on a silicon substrate, much of the substrate must be removed to provide this thermal insulation. By using a glass substrate, each element is inherently isolated.

Integration Choices

When designing the MEMS microphone on glass process flow, integration with current TFT technology is of the utmost importance. This consideration was a prime factor in choosing to develop the piezo-TFT transducer technology. The Piezo-TFT process flow is mostly identical to the TFT process, with the addition of a few steps. A few extra films, etches, and two mask steps are added to define the sacrificial material and the outline of the released structural elements.

Sacrificial Materials

A variety of materials have been considered for use as a sacrificial material. Other than thermal stability, polyimide has the very good properties. Unfortunately, since silicon films may be crystallized above the sacrificial layer, the sacrificial material must survive at higher temperatures. Aluminum nitride, while marginally harder to remove than polyimide, is otherwise an excellent material for use as a sacrificial film.

TABLE 3.2

Comparison of Sacrificial Materials

| Attribute | AlN | Al | Polyimide | Photoresist | SiO2 | Si |
|---|---|---|---|---|---|---|
| Wet etch | weak base | weak base | Piranha | Piranha | HF | TMAH/KOH |

TABLE 3.2-continued

Comparison of Sacrificial Materials

| Attribute | AlN | Al | Polyimide | Photoresist | SiO2 | Si |
|---|---|---|---|---|---|---|
| Wet etch compatibility | Good | Good | Excellent | Excellent | Poor | Poor |
| Dry etch | Poor $Cl_2$ | $Cl_2$ and/or $BCl_3$ | $O_2$ | $O_2$ | $CHF_3$, $Cl_2$, and/or $CF_4$ | $SF_6$ or $Cl_2$ |
| Dry etch compatibility | Fair | Fair | Excellent | Excellent | Fair | Fair |
| Deposition temp. | Low | Low | 25 C. | 25 C. | 400 C. | 400+ C. |
| Cure/Anneal | None | None | 400 C. | 150 C. | None | 500 C. |
| Max temp | >1100 C. | <500 C. | <450 C. | <150 C. | >1100 C. | >1100 C. |
| Stress | Moderate | Moderate | Low | Low | Moderate | Moderate |
| Contamination risk | Moderate | Moderate | Fair | Fair | Low | Low |

AlN can be etched away by weak base, so both crystallized Si and SiO2 can survive the releasing process. AlN can be deposited at low temperature which is compatible with TFT process. AlN can survive high temperature thermal treatment steps. AlN has low stress level, and with proper containment, adds no contamination to the TFT process.

Since AlN can be deposited before any of the transistor layers, it does not contaminate the sensitive regions, since the AlN film is entirely encapsulated in SiO2 until the very last step of processing, when it is removed. This ensures that none of the aluminum will migrate into the silicon channel or gate oxide.

The high temperature stability of AlN is critical since TFT processes may include several anneal steps at 650 C. and a laser crystallization step, which heats the surface film to over 1000 C.

Aluminum nitride is easily stripped with a weak base, such as TMAH or ammonium hydroxide. These wet chemicals do not react with the substrate or other sensitive films in TFTs, such as silicon, oxide, titanium, or titanium nitride. These wet etchants strip aluminum at roughly the same rate as aluminum nitride. Therefore, aluminum films must be protected with TiN. This protection step occurs naturally during the bond pad masking step. Further, excellent adhesion can be achieved between the AlSi wires and the TiN/Al stack.

An alternative film to AlN is spin-on polyimide. Polyimide has most of the good properties of AlN except its thermal stability. The maximum temperature it can withstand is about 450 C. An advantage of polyimide is that it can be stripped in an oxygen plasma, which is essentially harmless to all TFT films including aluminum.

Low Stress Oxide

The low stress TEOS may have slightly adverse affects on the electrical properties of TFT devices, but this can be worked around. For example, in the TFT flow, the base-coat SiO2 layer serves a dual purpose—it provides a clean electrical interface to the bottom of the active silicon channel and it acts as a barrier to any contaminants that may be present in the glass substrate. In the Piezo-TFT flow, the base-coat serves an additional function as the structural component of the microphone. If the low-stress base-coat SiO2 proves to have poor interface properties, a thin (500 A) layer of the standard TFT recipe SiO2 can be deposited on top of the low-stress SiO2 structural film.

From a mechanical perspective, 500 A of high stress SiO2 on top of 5000 A of low stress SiO2 has essentially have no effect. Electrically, the combination of two recipes of SiO2 functions well as an interface layer and a barrier layer. Process-wise, there is essentially no added complexity to depositing one recipe after another (without the wafer leaving the chamber).

Microphone Transducer Design

The MEMS device transducer converts energy of one type to another, such as mechanical to electrical. There are a wide variety of well-understood transducer types available, and each has its own advantages and disadvantages.

Theory of Sensing Elements

Among the many electro-mechanical transducers commonly in use, the search for the most appropriate types for a microphone application can be limited. The primary goals are high sensitivity, low noise, wide frequency response, ease of integration into the TFT process flow, and low power consumption. Most conventional macroscopic microphones use capacitive sensors (e.g. condenser). Many MEMS microphone designs use capacitive sensors as well, due to their high sensitivity. Other microphone designs have used a piezo-resistive element or a piezo-electric sensor. Additionally, a novel transducer type, referred to herein as a Piezo-TFT sensor, has been developed.

MEMS Condenser Microphone

Figure 8:
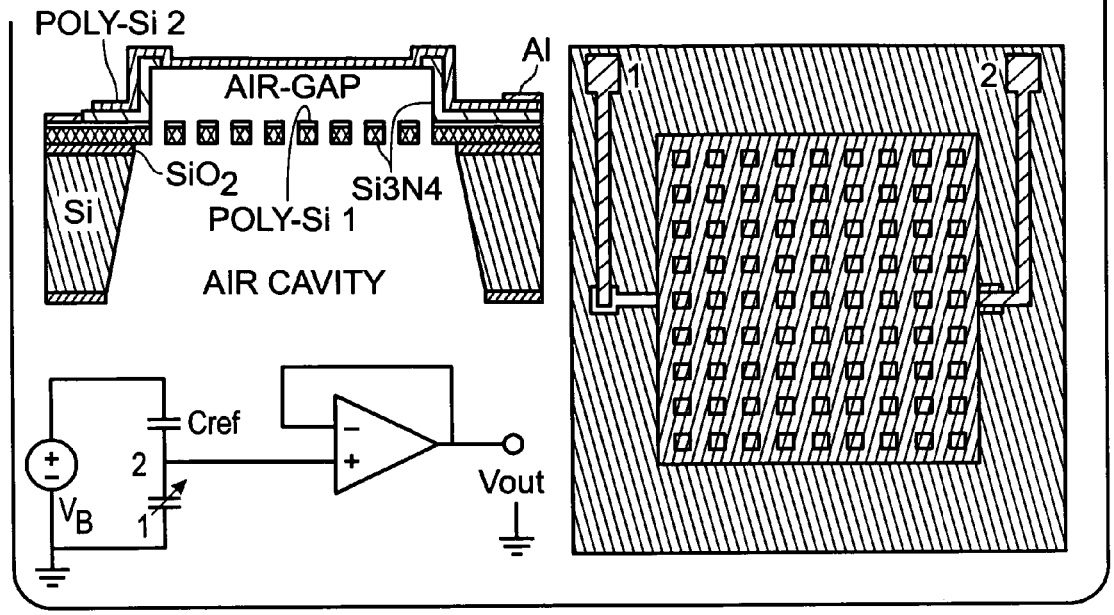
FIG. 8 is a diagram depicting a MEMS condenser microphone and its working principle.

FIG. 8 is a diagram depicting a MEMS condenser microphone and its working principle. Condenser microphones employ air-gap capacitors to convert acoustic pressure to an electrical signal. FIG. 8 shows the generic design of a MEMS condenser microphone and its working principle. MEMS condenser microphones have excellent performance characteristics, but they suffer from a complex fabrication process due to the large air-gap requirement between plates. Trade offs among sensitivity, frequency response and structure robustness require relatively thick films (several microns). This makes it difficult to integrate a MEMS condenser microphone with CMOS circuitry.

MEMS Piezoelectric Microphone

Figure 9:
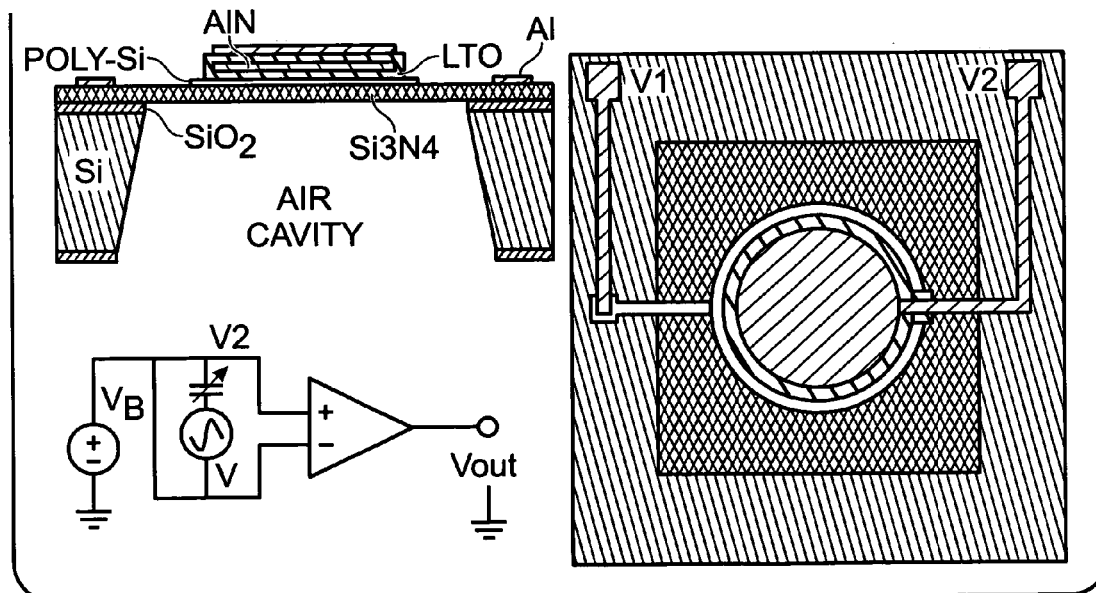
FIG. 9 is a diagram depicting a MEMS piezoelectric microphone.

FIG. 9 is a diagram depicting a MEMS piezoelectric microphone. Piezoelectric microphones, which do not have an air gap, have a more robust fabrication process than condenser microphones. As shown in FIG. 9, for l>> a, the electric field at point m is:

$$E_m = E_+ + E_- \approx \frac{3q}{4\pi\varepsilon r^2} - \frac{3q}{4\pi\varepsilon r^2} = 0$$

No potential and electric field appear as if the charges are coincident at their center of gravity (point o).

Apply a force σ on the molecule, the line OD to rotate counter clockwise by a small angle dθ, this strain shifts the center of gravity of the three positive and negative charges to the left and right, respectively. A dipole moment p=qr, is created which has an arm r=$3^{3/2}$adθ. Therefore the polarization (or dipole moment per unit volume) for a film contains N such molecules is:

$$P=Nq3^{3/2}ad\theta$$

This polarization P equals the surface charge per unit area, which can be detected by circuitry shown.

Figure 10:
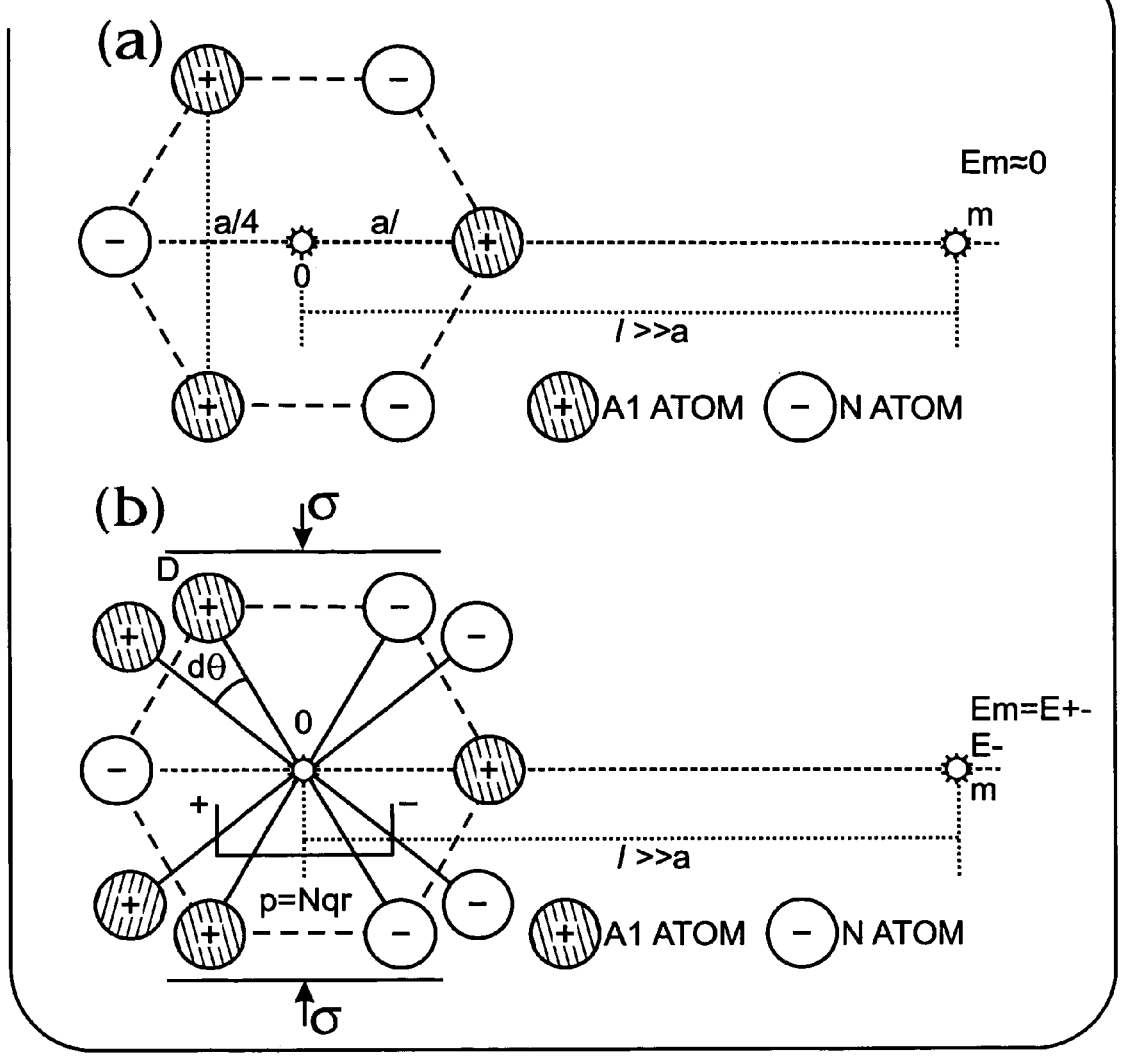
FIG. 10 depicts the origins of the piezoelectric effect.

FIG. 10 depicts the origins of the piezoelectric effect.

MEMS Piezoresistive Microphone

Figure 11:
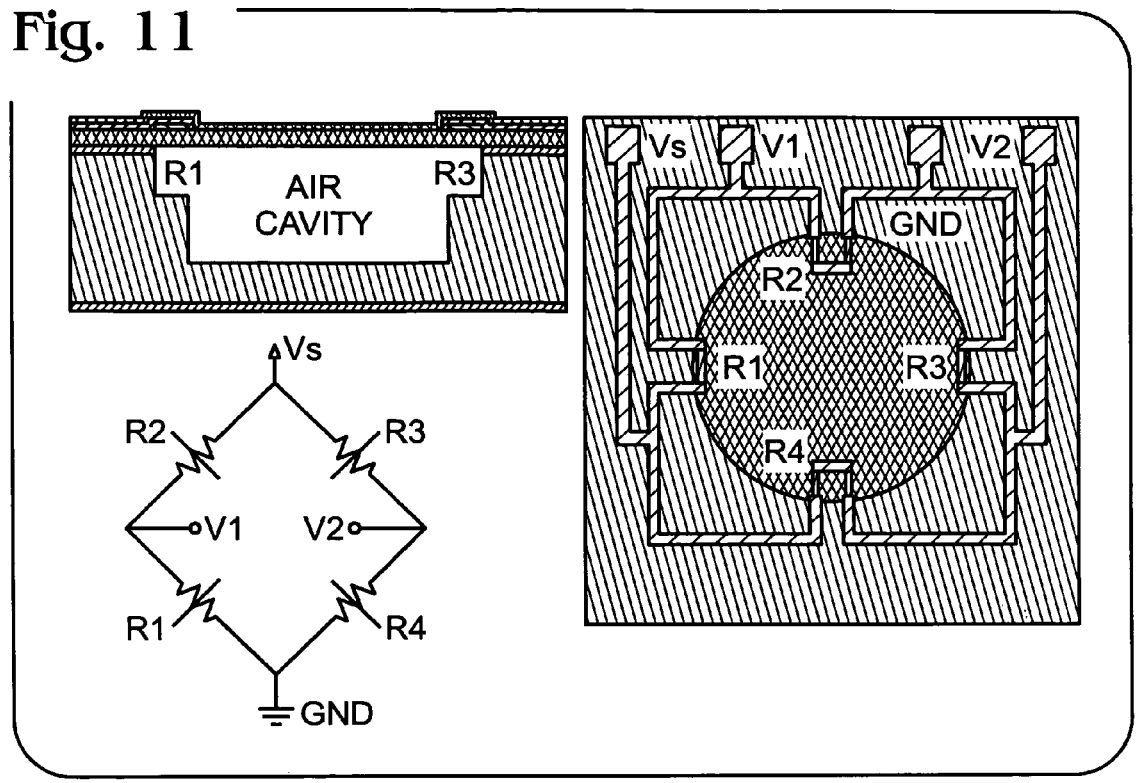
FIG. 11 depicts a piezoresistive microphone.

FIG. 11 depicts a piezoresistive microphone. The microphone is based on a conventional piezoresistive scheme, incorporating three energy domains. First, incident acoustic waves force the bending of the diaphragm, inducing a stress field which translates acoustic energy into mechanical strain energy. Piezoresistors rigidly attached to the diaphragm feel this strain and exhibit a change in resistivity. This change in resistivity causes a change in resistance, translating the mechanical energy into the electrical domain. The resistance modulation is detected through a fully active Wheatstone bridge.

Temperature drift is a common problem for piezoresistive transducers. Crystallized silicon films exhibit inconsistent orientation, this limits the maximum piezoresistive effect, and causes mismatch on the Wheatstone bridge. Doping the crystallized silicon film via implantation causes high density defects, which increases the noise floor of the microphone, dropping its sensitivity.

Relative resistance changes can be expressed using the longitudinal and transverse piezoresistive coefficients $\pi_l$ and $\pi_t$.

$$\Delta R/R=\pi_l\sigma_l+\pi_t\sigma_t$$

Piezoresistors are often aligned to the [110] direction of a (100) silicon wafer to achieve maximum piezoresistive coefficients.

The piezoresistive coefficients of silicon at room temperature are listed in Table 4.1. The longitudinal and transverse piezoresistive coefficients in [110] direction are listed in Table 4.2.

TABLE 4.1

Piezoresistive coefficients, T = 25 C.

| | ρ (Ω-cm) | $\pi_{11}$ (×$10^{-11}$ $Pa^{-1}$) | $\pi_{12}$ (×$10^{-11}$ $Pa^{-1}$) | $\pi_{44}$ (×$10^{-11}$ $Pa^{-1}$) |
|---|---|---|---|---|
| n-type | 11.7 | −102.2 | 53.4 | −13.6 |
| p-type | 7.8 | 6.6 | −1.1 | 138.1 |

TABLE 4.2

Longitudinal and transverse piezoresistive coefficients in [110] direction

| n-type | $\pi_l$ = −31.2 × $10^{-11}$ $Pa^{-1}$ | $\pi_t$ = −17.6 × $10^{-11}$ $Pa^{-1}$ |
| p-type | $\pi_l$ = 71.8 × $10^{-11}$ $Pa^{-1}$ | $\pi_t$ = −66.2 × $10^{-11}$ $Pa^{-1}$ |

The piezoresistive scheme is attractive for MEMS microphones, because of the likelihood of full integration with the TFT process. The design presented above has the disadvantage of a low sensitivity. To achieve a high enough sensitivity, a novel structural design can be used to enhance the piezoresistive effect while keeping an acceptable cutoff frequency. The features of the piezoresistive element can be fabricated concurrently with TFT fabrication, using the same masks and films as the transistors.

Stress Concentrated MEMS Piezoresistive Microphone

Figure 12:
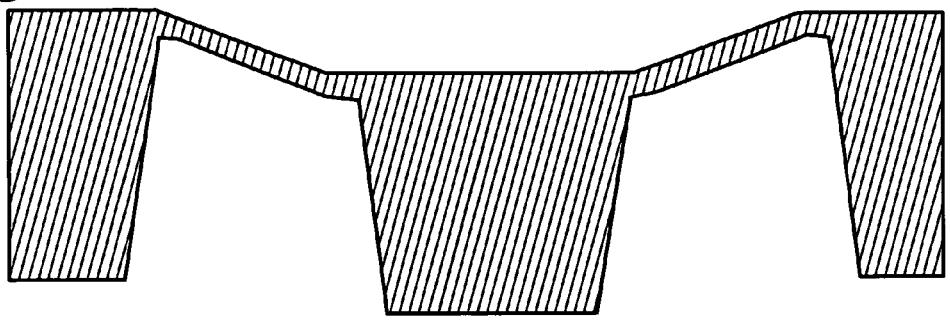
FIG. 12 depicts a stress concentration method adapted for bulk micromachining.

FIG. 12 depicts a stress concentration method adapted for bulk micromachining. Stress concentration methods are frequently adopted in the MEMS world to gain a maximum piezoresistive effect. The figure shows a method for concentrating stress to the thin-film area in bulk micromachining, usually in the form of clamped thin beams/membranes isolated by thick solid islands. Compared with the thin beams/membranes, the islands bend much less under a certain pressure. Major bending happens on thin beam/membrane area. As a result, stresses and strains are concentrated on thin beam/membrane areas To apply this technique to a surface micromachined microphone design, a few additional factors need be considered. One is the residual stress in the membrane, and another is the resonant frequency. This is different from bulk micromachined structures, which essentially have no residual stress, as surface micromachining technology uses CVD/sputtered films as structural films. Inevitably, a certain amount of residual stresses are inherent in the films, resulting in either buckling or stiffness deviation from design.

A cantilever is one of the best structures for releasing stress, and it is adopted widely in a variety MEMS devices. For MEMS microphone applications, a cantilever structure is not very efficient in collecting acoustic pressure. To overcome this drawback, a cantilever with a membrane tip area has been modified to achieve both maximum stress releasing and maximum acoustic pressure collection efficiency. By fabricating the membrane tip area thicker than the cantilever beam part, a higher level stress can be concentrated on the cantilever beam part. Integrating piezoresistors on highly stressed areas provides higher sensitivity.

Figure 13:
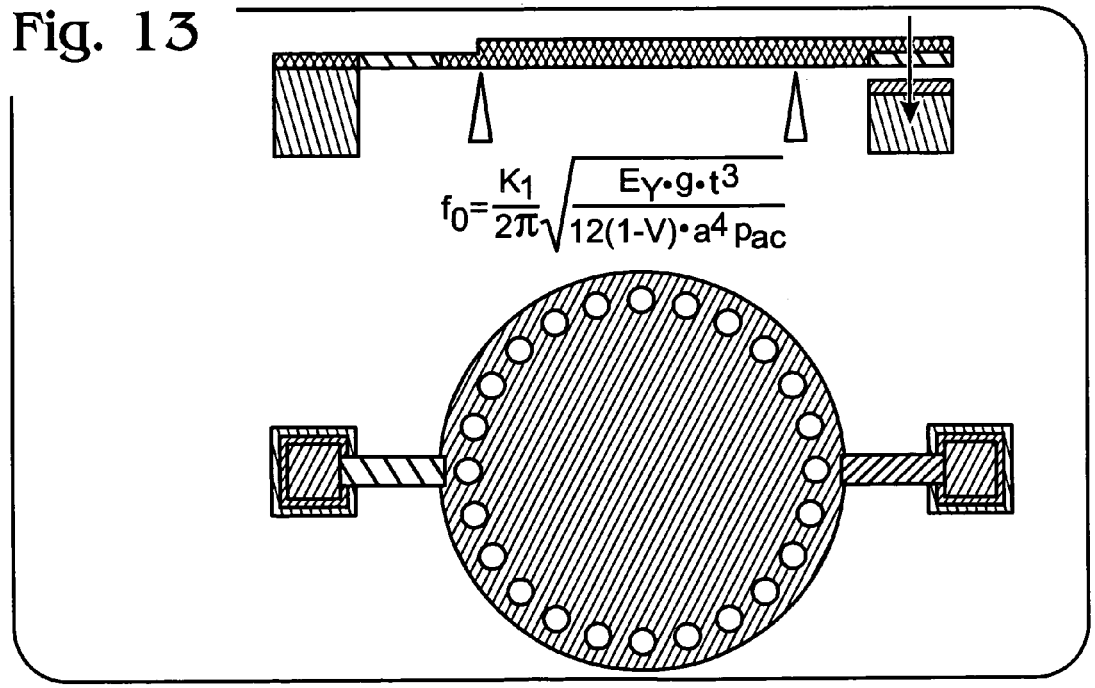
FIG. 13 depicts a design for stress concentration and resonant frequency decoupling.

FIG. 13 depicts a design for stress concentration and resonant frequency decoupling. Conventionally, a thin cantilever beam decreases the system cutoff frequency, for it has low spring constant. By introducing a simply support boundary condition to the pressure collecting membrane, the cutoff frequency is determined by the membrane, not the spring constant of the thin beam, while the stress concentration still works at thin beam part. The whole structure is fabricated as a modified cantilever that releases most of the residual stress. When in use, an electrostatic force is applied to clamp the right hand beam; this results in a double clamped beam structure with membrane central area for pressure collection. Piezoresistors are built on the left hand stress concentrated beam area.

To realize the novel structure with a TFT compatible process, 3 to 4 masks are introduced to the existing TFT process flow. One mask is used to form dimple structures for realizing the simply supported boundary condition. The second mask is used to define the outline of the whole microphone structure. The third one is to prevent nickel deposition on the piezoresistors prior to the silicide step, and the last one is to open the through holes forming the acoustic cavity. The figure illustrates the cross-section of a piezoresistive sensing microphone, which is process compatible with TFT (shown on right side).

Figure 14:
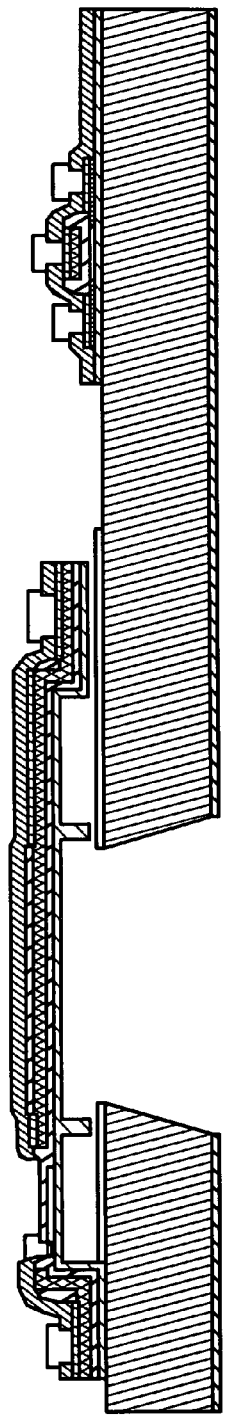
FIG. 14 is a partial cross-sectional view of a piezoresistive sensing microphone.

FIG. 14 is a partial cross-sectional view of a piezoresistive sensing microphone.

MEMS Piezo-TFT Microphone

The operation principle of Piezo-TFT is based on the fact that the mobility of carriers in a MOSFET device change as stress is applied to the channel. If this MOSFET is placed in a high-stress region of a cantilever or membrane, the change in mobility will be detectable and directly related to the motion of the MEMS structure. The fabrication process is inherently compatible with the TFT flow. A theoretical analysis of a Piezo-TFT shows that the carrier's mobility change is not the only effect on a Piezo-TFT measurement. The channel width and length will change as the device is stressed, and also contributes to the piezo effect. Analysis shows that this change in channel dimensions adds slightly to the sensitivity of the Piezo-TFT sensor. Simulation of a Piezo-TFT sensing scheme for a microphone shows a reasonable output voltage under acoustic pressure.

It is well known that a semiconductor carrier's mobility varies when the channel is strained. Changes in a carrier's mobility affects other electrical properties, such as resistivity. In fact, the piezoresistive effect is one of the results of carrier's mobility change under an applied pressure.

The drain current of a MOSFET transistor is proportional to the magnitude of a carrier's mobility.

$$i_D = \frac{1}{2} C_{OX} \mu \frac{W}{L} (V_{GS} - V_t)^2$$

For a solid state MOSFET transistor, a constant carrier mobility is preferred. Any change of the mobility will result in the characteristics of a MOSFET shifting, which is unacceptable for circuit applications. However, for the purpose of sensing stress/strain change, this kind of change is desirable.

Figure 15:
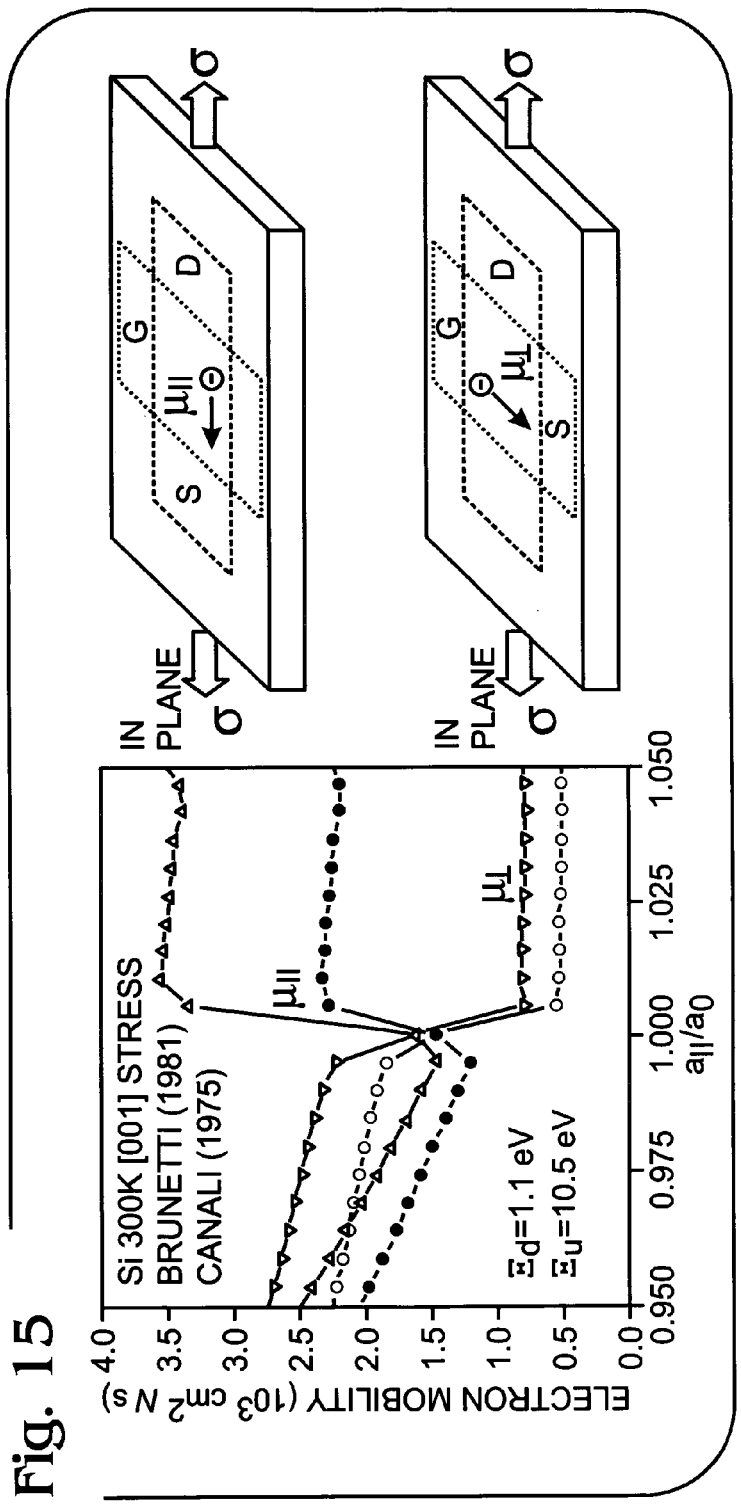
FIG. 15 shows the experimental and theoretical results of electron mobility in Si under strain.

FIG. 15 shows the experimental and theoretical results of electron mobility in Si under strain. Stress/strain change affect carrier mobility. Electron mobility parallel to the stress direction increases linearly when strain increase from 0 to 1%. For convenience of further discussion, we define the rate of mobility change vs. strain change as $$\kappa_\varepsilon = \frac{d\mu}{\mu} \bigg/ d\varepsilon$$

Where $d\varepsilon$ is the strain change, and $$\frac{d\mu}{\mu}$$

is the relative change of mobility.

From the figure we find that for electrons in single-crystal silicon along the direction of the strain, $$\kappa_{\varepsilon \cdot e} = \frac{d\mu_e}{\mu_e} \bigg/ d\varepsilon \approx +200.$$

For holes, the mobility in single-crystal silicon increases under a compressive strain/stress by a factor of about 50%, meaning that $$\kappa_{\varepsilon \cdot h} = \frac{d\mu_e}{\mu_e} \bigg/ d\varepsilon \approx -150.$$

To use the stress changed induced drain current change effect for pressure sensing purposes, MOSFET transistors can be built on a deflectable membrane or cantilever. A lateral pressure load applied to a cantilever or membrane induces a bending stress/strain, causing the mobility change and exhibits a drain current change. Compared with the strain induced by a lattice mismatch in strained silicon thin-film, the bending strain is much smaller. For a cantilever with length l, width W, thickness t, Young's modulus $E_Y$, Poisson's ratio v, the induced strain at the clamped end under pressure P is $$\varepsilon = \frac{6(1-v)Pl^2}{E_Y t^2}.$$

As a practical estimation, a 300 um long, 60 um wide, 0.6 um thick cantilever under 1 Pa pressure induces a strain of $$d\varepsilon = \frac{6(1-v)Pl^2}{E_Y t^2} = \frac{6(1-0.25) \cdot 1 \text{ Pa} \cdot (300 \text{ μm})^2}{(160 \times 10^9 \text{ Pa}) \cdot (0.6 \text{ μm})^2} = 7.04 \times 10^{-6}.$$

So the relative drain current change induced by mobility change is $$\frac{dI_d}{I_d} = \frac{d\mu}{\mu} = \kappa_{\varepsilon e} \cdot d\varepsilon = 200 \times 7.04 \times 10^{-6} = 1.408 \times 10^{-3}$$

for a NMOSFET, and $$\frac{dI_d}{I_d} = \frac{d\mu}{\mu} = \kappa_{\varepsilon h} \cdot d\varepsilon = -150 \times 7.04 \times 10^{-6} = -1.06 \times 10^{-3}$$

for a PMOSFET.

For a big transistor with a micro- to milli-ampere drain current, the absolute drain current change is in the range of nano- to micro-ampere, which is small but still measurable. Also, a big transistor with milli-ampere drain current means a high continuous power consumption, which is not desirable.

Figure 16:
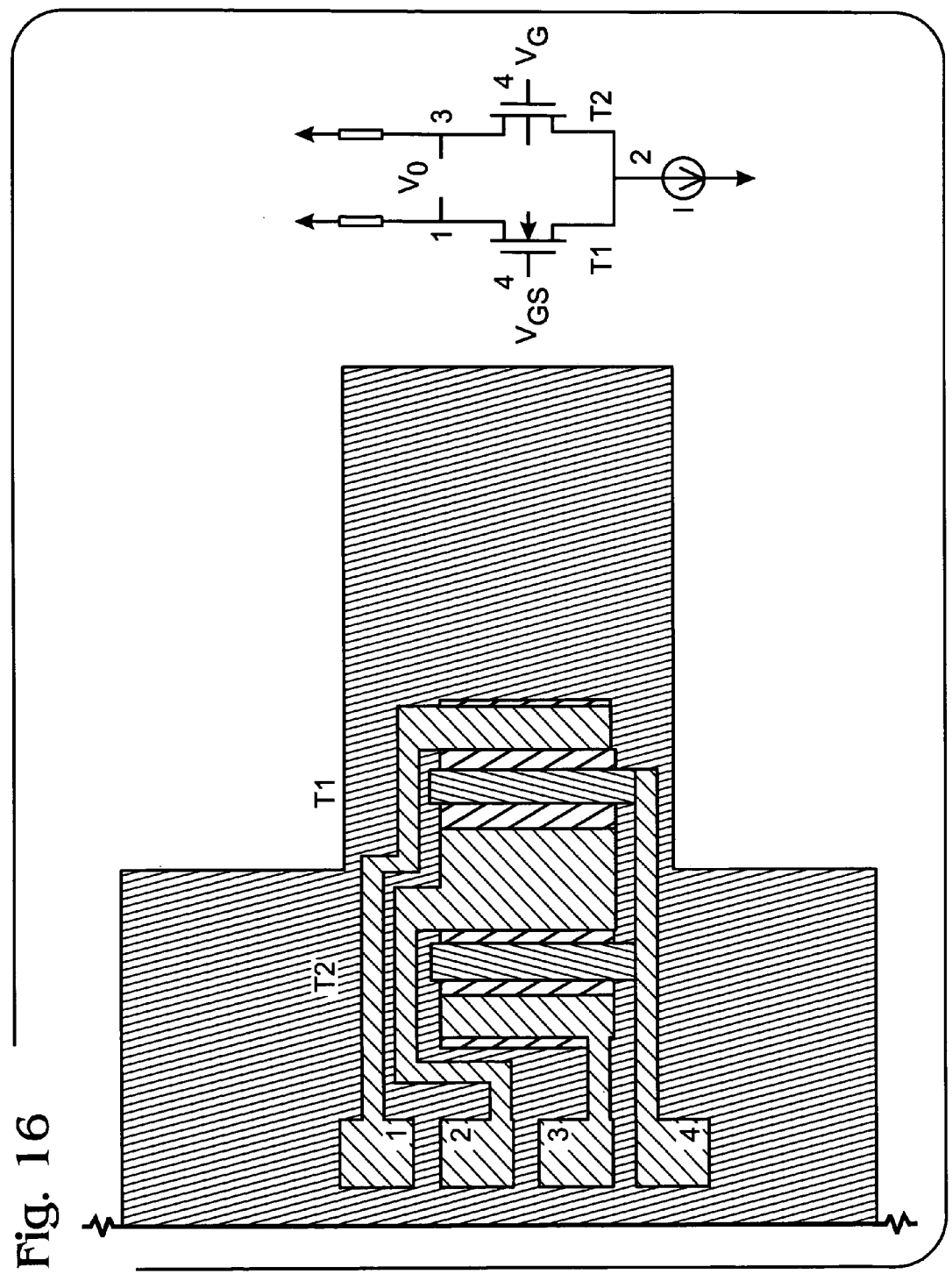
FIG. 16 depicts a Piezo-TFT FET sensing differential pair design that avoids high level drain current, while yielding a reasonable output signal.

FIG. 16 depicts a Piezo-TFT FET sensing differential pair design that avoids high level drain current, while yielding a reasonable output signal. T1 and T2 are a differential MOS pair. For the stress sensing application, T1 is placed at the edge of cantilever and T2 placed on the solid substrate as a reference. Analyzing the offset voltage of a MOSFET differential pair $$V_o = \frac{1}{2}(V_{GS} - V_t)\frac{d\mu}{\mu}.$$

For a typical $V_{GS}$=5V and $V_t$=0.8V, the output voltages are calculated to be 2.96 mV for a NMOSFET device and −2.23 mV for a PMOSFET device, which are quite reasonable for further amplification.

This scheme uses two TFT devices adjacent to each other, taking advantage of their uniformity. The near-identical properties of two neighboring devices in poly-silicon technology permits a differential pair to be created, removing common-mode signals, and leaving behind only the results of the measurement.

For a cantilever with length l, width W, thickness t, Young's modulus $E_Y$, Poisson's ratio v, the induced strain at the clamped end under pressure P is $$\varepsilon = \frac{6(1-v)Pl^2}{E_Y t^2}$$

As a practical estimation, a 300 um long, 60 um wide, 1 um thick cantilever under 0.1 Pa (74 dB, which is the normal speaking acoustic pressure) will induce a strain of $$d\varepsilon = \frac{6(1-v)Pl^2}{E_Y t^2} = \frac{6(1-0.25) \cdot 0.1 \, \text{Pa} \cdot (300 \, \mu m)^2}{(160 \times 10^9 \, \text{Pa}) \cdot (1.0 \, \mu m)^2} = 2.54 \times 10^{-7}.$$

So the relative electron mobility change induced by the strain change is $$\frac{d\mu}{\mu} = \kappa_{\varepsilon c} \cdot d\varepsilon = 200 \times 2.54 \times 10^{-7} = 5.1 \times 10^{-5}$$

Microphone Sensitivity

Open circuit sensitivity of a microphone is defined as the induced electric voltage from one unit of acoustic pressure:

$$S = \frac{dV}{dP}$$

For each type of microphone, the expressions of sensitivity are different from one another, due to the different sensing schemes.

To simplify comparison, assume the deflectable diaphragm of each of the three type of microphones has same dimensions (radius a, thickness t, Young's modulus $E_Y$, Poisson ratio v), and same boundary conditions (simply supported). A DC biasing voltage $V_B$ is applied. Table 4.3 summarizes the sensitivity expressions for all three types of microphones.

TABLE 4.3

| Sensitivity equations for MEMS transducers | |
|---|---|
| Condenser microphone | $S_c = V_B \dfrac{3(5+v)(1-v)}{16} \cdot \dfrac{1}{E_Y} \cdot \dfrac{a^4}{g_0 \cdot t^3}$ |
| | $g_0$ is the air gap between the deflectable diaphragm and the fixed electrode |
| Piezoelectric microphone | $S_{pe} = \dfrac{4+v}{4} \cdot \dfrac{d_{31} \cdot t_{pz}}{\varepsilon_r \varepsilon_0} \cdot \dfrac{a^2}{t^2}$ |
| | $d_{31}$ is the piezoelectric stress constant<br>$t_{pz}$ is the piezoelectric film thickness<br>$\epsilon_r$ is the relative permittivity of the piezoelectric film |
| Piezoresistive microphone | $S_{pr} = V_B \dfrac{3(1-v)}{8} \cdot \pi_{44} \cdot \dfrac{a^2}{t^2}$ |
| | $\pi_{44}$ is piezoresistive coefficient of silicon |

TABLE 4.3-continued

| Sensitivity equations for MEMS transducers | |
|---|---|
| Piezo-TFT | $S_{pzmos} = \dfrac{3(1-v)l^2}{E_s t^2} \cdot \kappa_\varepsilon \cdot (V_{GS} - V_T)$ |
| | $E_s$ is the Young's modulus of MEMS cantilever<br>l is the cantilever length<br>t is the cantilever thickness<br>$V_{GS}$ is the TFT pair gate-source voltage<br>$V_T$ is the threshold voltage of TFT pair<br>$\kappa_\varepsilon$ is the rate of mobility change vs. strain change |

From the above sensitivity expressions, it can be concluded that sensitivity is nonlinearly proportional to the ratio of diaphragm radius over thickness a/t. Compared to the piezo type microphones, a condenser microphone is more sensitive to diaphragm dimension deviations; this requires tighter process control for condenser microphones.

Table 4.4 lists numerical results of sensitivities based on the assumption that $V_B=10$V, radius $\alpha=300$ um, thickness t=1 um, Young's modulus $E_Y$ 165 GPa, Poisson ratio v=0.25, and $g_0=4$ um, $d_{31}=7.1\times10^{-12}$ C/N, $t_{pz}=2000$ A and $\epsilon_r=8.5$ and $\pi_{44}=138.1\times10^{-11}$Pa$^{-1}$, and $V_{GS}=5.0$ V and $V_T=0.8$ V.

TABLE 4.4

| Sensitivity expressions of MEMS microphones | |
|---|---|
| Condenser microphone | 90.6 mV/Pa |
| Piezoelectric microphone | 1.8 mV/Pa |
| Piezoresistive microphone | 0.35 mV/Pa |
| Piezo-TFT microphone | 2.96 mV/Pa |

According to the numbers in Table 4.4, one might have the first impression that a piezoresistive scheme is not promising due to its low sensitivity, despite its more robust process and highest probability of full compatibility with the existing TFT materials and process flow. Using creative designs, however, the sensitivity can be improved by at least one order of magnitude. This would make its performance more than acceptable.

By locating the piezoresistors on locally thinned regions of a constant thickness diaphragm, the sensitivity can be represented as $$S_{pr} = V_B \frac{3(1-v)}{8} \cdot \pi_{44} \cdot \frac{a^2}{t \cdot t_{pr}},$$

where $t_{pr}$ is the piezoresistor film thickness.

The typical thickness of crystallized silicon is 500 A in many TFT processes. Using this number and the same dimensions and material in the previous calculations, the new sensitivity is 7.0 mV/Pa, which is acceptable for audio microphone applications.

Cutoff Frequency

The cutoff frequency is another important parameter for specifying the dynamic performance of a MEMS microphone. The cutoff frequency of a microphone can be approximated using the first resonance frequency of the diaphragm in the case of air damping. The first resonance frequency of a simply supported circular diaphragm is expressed as, $$f_0 = \frac{K_1}{2\pi} \sqrt{\frac{E_Y \cdot g \cdot t^3}{12(1-v) \cdot a^4 p_{ac}}},$$

where $K_1 = 4.99$ is a constant, $g = 9.8$ m/s² is gravitational acceleration constant, $P_{ac}$ is the acoustic pressure, a is diaphragm radius, t is the diaphragm thickness, $E_Y$ is Young's Modulus and v is Poisson ratio.

According to this expression, the resonance frequency of this diaphragm is nonlinearly inversely proportional to the ratio of the diaphragm radius over its thickness a/t. Recalling that sensitivity is nonlinearly proportional to the ratio of diaphragm radius over thickness a/t, a trade off must be made between sensitivity and bandwidth.

Given the dimensions of previous calculations, a=300 um, t=1 um, $E_Y$=165 GPa, v=0.25 and $P_{ac}$=0.1 Pa, the first resonance frequency is $f_0$=10.5 KHz, which is high enough for telephone-based applications.

From the expression of $f_0$, it can be concluded that the thickness of the whole diaphragm can't be too thin; otherwise the resonance frequency is too low. Therefore, a thick enough composite structure must be used, and not simply a 500 or 1000 A crystallized silicon film. Another consideration limiting the minimum thickness of the diaphragm is its mechanical robustness. A very thin-film is more likely to fail.

Microphone Summary

A piezo-TFT sensor is determined to be an interesting candidate as a MEMS microphone. Piezo-TFT is the easiest transducer technology to integrate with the TFT process flow—no exotic materials are required, no major modifications to TFT design and films, and the piezo-TFT transistor can be fabricated concurrently with the other TFT components.

In addition to its ease of integration, piezo-TFT transducers can easily be used in other high sensitivity MEMS applications, such as biomaterial sensors, microfluidic applications, and inertial sensors. This permits the re-use of the piezo-TFT technology in future applications.

Besides the Piezo-TFT based microphone, it is feasible to integrate a piezoresistive MEMS microphone on TFT display through optimization of the structural design. The processes and films for fabricating the piezoresistive MEMS microphone are fully compatible with the existing SLS TFT technology. One more viable scheme is a piezoelectric MEMS microphone design, based on the piezoelectric effect of an AlN film. The process for fabricating AlN piezoelectric MEMS microphones is also compatible with existing SLS laser annealing TFT technology.

TABLE 4.5

Comparison of different types of microphones

| | | Condenser microphone | Piezoelectric microphone | Piezoresistive microphone (conventional) | Piezoresistive microphone (modified) | Piezo-TFT microphone |
|---|---|---|---|---|---|---|
| Sensitivity | | high | relatively low | low | good | high |
| Frequency range | | wide | wide | wide | wide | wide |
| Power consumption | | low | low | moderate | moderate | moderate |
| Fabrication complexity | | high | medium | low | low | low |
| Compatibility with silicon substrate CMOS technology | Film types | fully | foreign film involved | fully | fully | fully |
| | Film thickness | poor | good | good | good | good |
| | Process flow | poor | moderate | good | good | good |
| Compatibility with glass substrate TFT technology | Film types | N/A | foreign film involved | fully | fully | fully |
| | Film thickness | N/A | good | good | good | good |
| | Process flow | N/A | moderate | good | good | good |

Membrane Design

Due to the advantages of surface micromachining, the shape of the microphone membrane can be defined without restriction. The optimal shape is a circular membrane or cantilever shape, which provide the best sensitivity, stress relief, and is the simplest to analyze.

The performance of a round membrane can be analytically solved to first order, and the choice of a 600 um diameter membrane is a balance between sensitivity, frequency response, and yield. The cutoff frequency is over 15 kHz.

Substrate-based Acoustic Cavity

Most silicon-based microphone systems have a large cavity behind the membrane to achieve high acoustic compliance and to simplify the release process step. Typically this cavity is fabricated using a crystallographic etchant (KOH or TMAH) when using silicon substrates. With a glass substrate ultrasonic machining techniques may also be used.

Methods of Relieving Stress/Anchoring the Membrane

FIGS. 17 and 18 depict a 2-mask and 4-mask method, respectively, for fabricating a membrane. When designing large MEMS structures it is necessary to take into account any residual stress in the film and ensure that the device survives packaging, delivery, and mechanical abuse by the user. Therefore, the membrane must be anchored securely to the substrate without affecting the mechanical performance. The simple two-mask method is stiff and somewhat complicated to analyze due to the large number of contact points. The four-mask process creates dimples in the membrane allowing it to be simply supported on the dimples. This allows for simpler analysis and more compliance (and thus more sensitivity).

Exemplary Process Flow

FIGS. 19 through 33 illustrate an exemplary stepwise process flow, resulting in the Piezo-TFT transducer fabrication.

Figure 19:
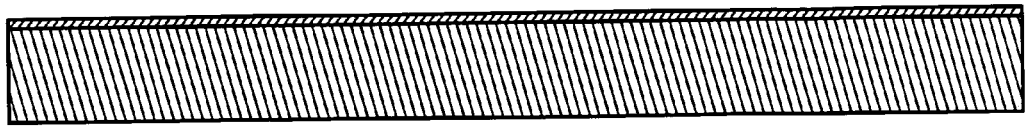
FIGS. 19 through 33 illustrate an exemplary stepwise process flow, resulting in the Piezo-TFT transducer fabrication.
Figure 20:
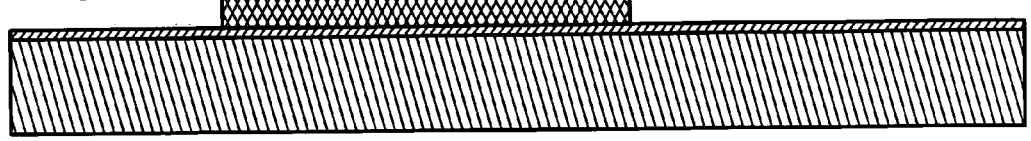
Figure 21:
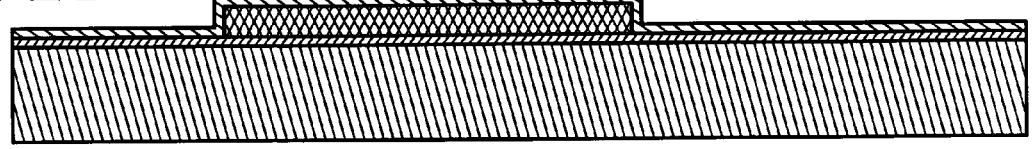
Figure 22:
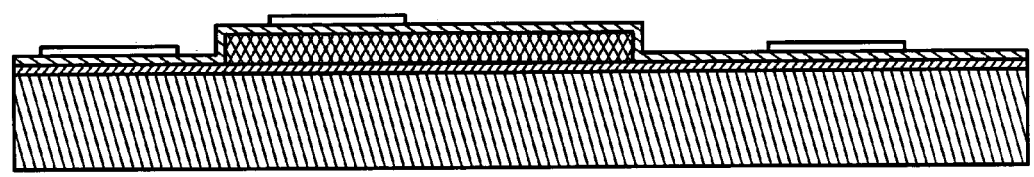
Figure 23:
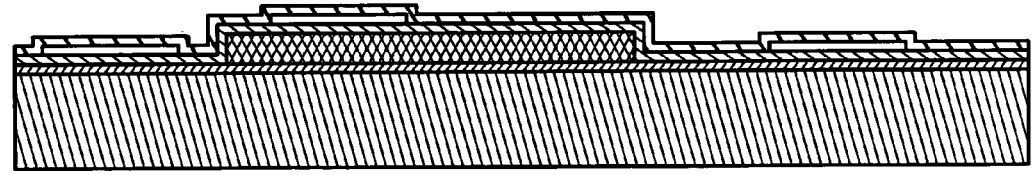
Figure 24:
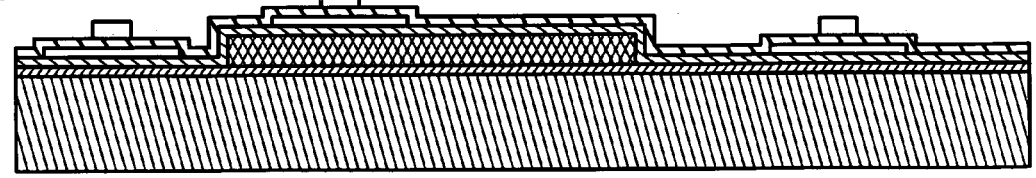
Figure 25:
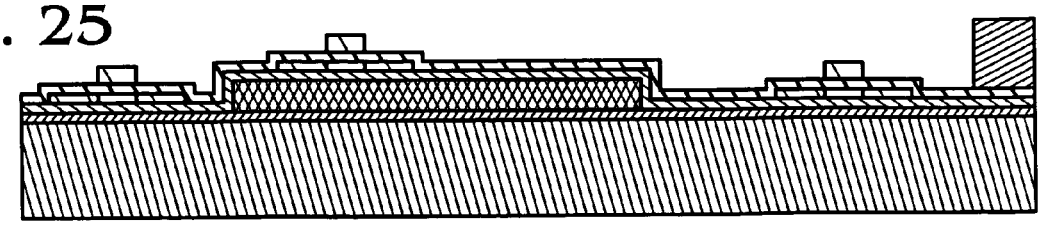
Figure 26:
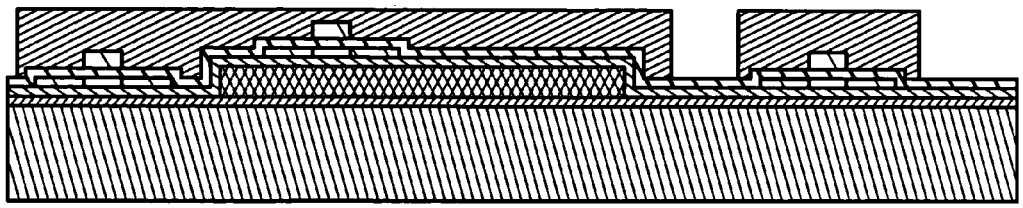
Figure 27:
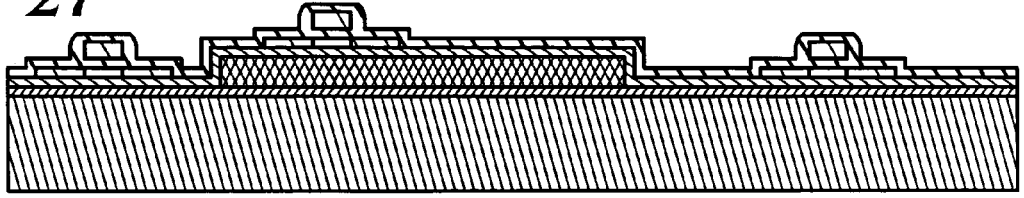
Figure 28:
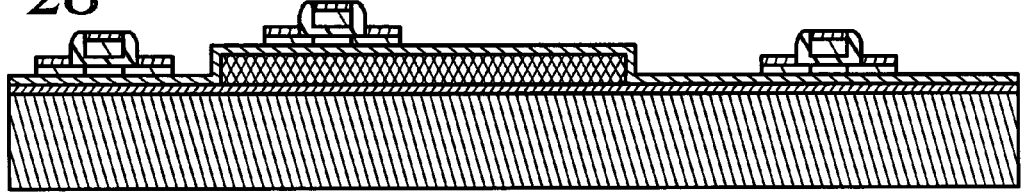
Figure 29:
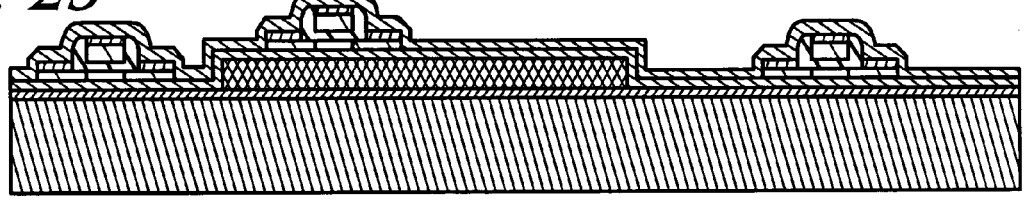
Figure 30:
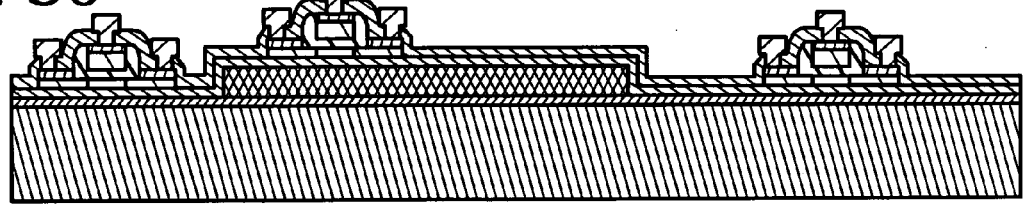
Figure 31:
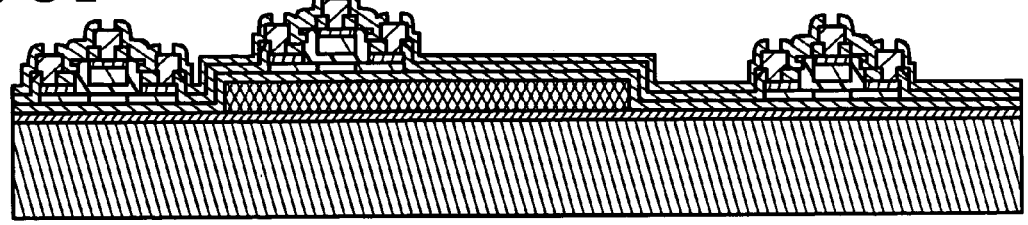
Figure 32:
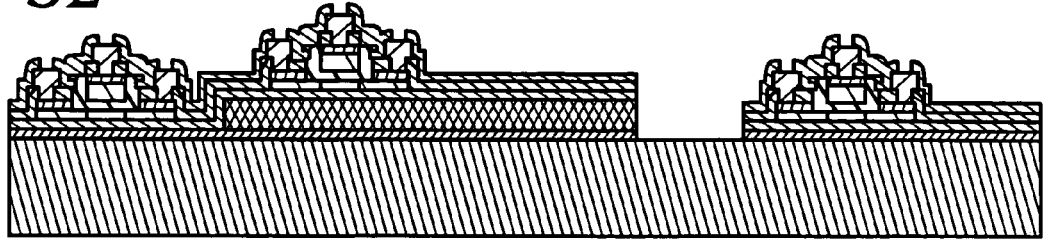
Figure 33:
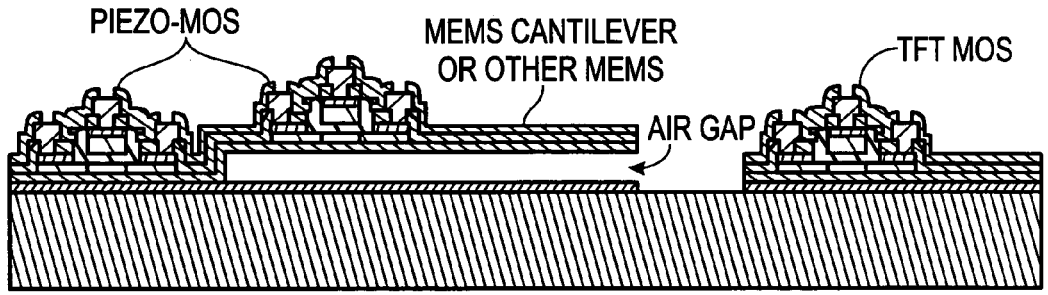

1, Start with a 6-inch glass or silicon substrate, See FIG. 19.
   PECVD deposit 5000 A a-Si for glass substrate.
   Mask SLA1-LCD-SB to get alignment marks.
   Etch a-Si.
   PECVD deposit 1500 A silicon oxide.
2, Sacrificial layer (FIG. 20)
   DC reactive sputter 1 um AlN.
   Mask SLAM2-SA to pattern sacrificial layer.
   RIE or wet etch AlN to define sacrificial mesa on MEMS area and clear out on TFT area.
3, SiO2 Structural/Base coat (FIG. 21)
   PECVD deposit 2500 A low stress TEOS SiO2 and 500 A standard TEOS SiO2 as "Base coat".
4, a-Si TFT channel (FIG. 22)
   PECVD 500 A a-Si.
   Laser crystallization.
   Mask SLAM2-AA to pattern c-Si.
5, PECVD 500 A gate oxide (FIG. 23)
6, Gate Poly (FIG. 24)
   PECVD 2000 A gate poly,
   Mask SLAM2-GP to pattern gate poly
7, Mask 4, (p-type protect), form n-regions by P+ implantation (FIG. 25)
8, Mask 5, (n-type protect), form p-regions by B+ implantation (FIG. 26)
9, Spacer SiO2 (FIG. 27)
   PECVD 6000 A TEOS oxide as spacer, RIE timed etch back, stop ~200 A from S/D poly
10, Silicide (FIG. 28)
   BOE dip to expose Poly-Si surface.
   Sputter Ni, RTA to form silicide.
11, Dielectric SiO2 (FIG. 29)
   PECVD 3000 A low stress TEOS SiO2 as intermediate dielectric film for TFT and the 2nd layer of MEMS structure
12, Metal (FIG. 30)
   Mask SLAM2-CO to pattern contact holes opening.
   Sputter Ti(200 A)//AlCu(1 um)/Ti(800 A) stacks,
   Mask SLAM2-ME to pattern top electrode and bond pads.
13, Passivation (FIG. 31)
   PECVD 4000 A low stress TEOS SiO2 as passivation layer and also the top layer of MEMS structure.
   Mask SLAM2-BP to pattern pad openings.
14, Define MEMS outline (FIG. 32)
   Mask SLAM2-CA to pattern outline of MEMS structures to be released.
   RIE etch through all low stress TEOS layers to form outline of MEMS structures.
15, Release (FIG. 33)
   Wet etch AlN to release MEMS structures integrated with Piezo MOS transducer.

Exemplary Design and Fabrication

The exemplary mask set was designed to use a minimum number of mask levels to fabricate Piezo MOS transducers on deflectable MEMS cantilevers, double clamped beams, and cantilever/membrane combinations. Integration with the TFT process flow is the first consideration, and the goal is to share as many TFT masks as possible, and introduce as few MEMS mask levels as possible.

One essential MEMS mask level is the sacrificial mask, which defines the location of the air gap between the deflectable MEMS structures and the substrate. The other necessary MEMS mask is the outline mask, which defines the perimeter of the MEMS structures after an RIE etch through the structural films. Such a mask is needed because not every layer in TFT process flow is patterned, and all layers are used as the composite structure. Thus, there is a need to separate the MEMS moving part from the fixed parts elsewhere.

In fact, there is no stress free and zero stress gradient film in the real world, though residual stress can be cut to very low level and stress gradients can be tailored. To further relieve any residual stress and weaken the influence of stress gradient, the support and anchor schemes of MEMS structures can be optimized. The price of introducing more mechanical features is more mask levels. The mask design tolerates some imperfections due to non-fully relieved stress in the structural film. As a result, simpler cantilevers were investigated for the relief of residual stress. Some cantilever/membrane combination structures were also investigated for the relief of residual stress. The dimensions of these cantilevers and membranes are from 105 um to 300 um in length, 36 um wide to 80 um, and the thickness can be adjusted by film deposition, ranging from 0.5 um to 1 um. These dimensions are the result of trade-offs between transducer sensitivity and mechanical cutoff frequency. For example, increasing cantilever length can improve transducer sensitivity, for more strain is induced in the Piezo-TFT channel, which increases electron mobility. However, increasing cantilever length makes the cantilever more compliant and cuts its resonant frequency, dropping its bandwidth. So a balance between the sensitivity and frequency response is a major consideration.

The exemplary mask set includes a variety of Piezo-TFT test structures. In all cases, one transistor of a MOS differential pair is placed on the solid substrate and another is placed on a flexible cantilever. To avoid any short channel effects and second order hot electron effects, the Piezo-TFT devices were designed with long channel sizes. The shortest channel length is 1 um, and up to 40 um in the "bending channel" Piezo-TFT designs. This mask set includes a design matrix of:

a) the space between two transistors of a MOS differential pair,
b) the distance between the transistor on the cantilever to the anchor,
c) transistor width,
d) transistor length,
e) width over length ratio,
f) channel orientation of the transistor on the cantilever,
g) cantilever length,
h) cantilever width, and
i) cantilever tip shape.

Two kinds of Piezo-TFT transducer designs are of special interest. One design puts a MOS transistor in a zone which has highest strain change when a cantilever deflects, and another puts a MOS transistor with very long channel on the region with the most bending, which is referred to herein as a "bending channel" Piezo-TFT. The difference between these two types of Piezo-TFT devices is that the first one has a uniformly strained channel, while the channel surface and bottom of the second one has different strains. The modeling of the "bending channel" Piezo-TFT is more complex than the conventional Piezo-TFT, but likely has a higher sensitivity.

To be certain the strain in the MOS channel is being measured, and not any parasitic currents, some "beam" structures were constructed. These are identical to the Piezo-TFT designs in every way, except they are physically clamped at both ends and flex significantly less. Therefore, the Piezo-TFT devices on the clamped structures output very small changes when applying actuation voltage relative to the cantilevered structures.

Another important consideration is the mechanical anchor. Anchors provide MEMS structures mechanical support, e.g. a physical attachment to the substrate, and an electrical connection path to the electronics devices built on top of the MEMS structures. A good design should provide a stiff anchor that can tolerate a certain amount stress and stress gradient deviations, so as to minimize the influence of residual stress on the MEMS structures. In the mask set, two designs of anchors were investigated: straight and corrugated. The straight anchor is simply a flat 90 degree corner. Corrugated anchors distribute the residual stress, minimizing the propagation of the anchor's spring effect relative to the straight anchor design. Additionally, the corrugated anchors provide a more robust physical connection to the substrate due to the larger connection area.

Various designs of piezoresistive sensing elements were also laid on the same mask set, using the crystallized silicon as the piezoresistors film. The piezoresistors are designed to follow the same process flow of the TFT transistors, where the only difference is that the piezoresistors have no source and drain areas.

In addition, to avoid any distortion of MEMS structures mechanical performance, some dummy patterns were introduced to make the MEMS structures surface highly symmetric.

Transducer Optimization

There are several paths that can be taken to improve the performance of the initial Piezo-TFT devices. They include changing membrane characteristics to be thinner and longer. The stiffness of the membrane can be lowered, making it more sensitive to noise. An array of membranes can be used to improve signal-to-noise ratio. An array of several (4 or 9) adjacent membranes connected in series produce an improved output current. This higher current permits simpler amplification schemes.

Further, the sensing TFT design can be optimized. Conventional TFT devices are designed for digital operation. Analog transistors, however, improve the linearity and output range of our Piezo-TFT devices. A low noise amplifier can be integrated with the transducer (on glass). By placing a low noise current amplifier near the membrane on the same substrate, all sorts of parasitic noise can be reduced, improving the signal-to-noise ratio.

Figure 34:
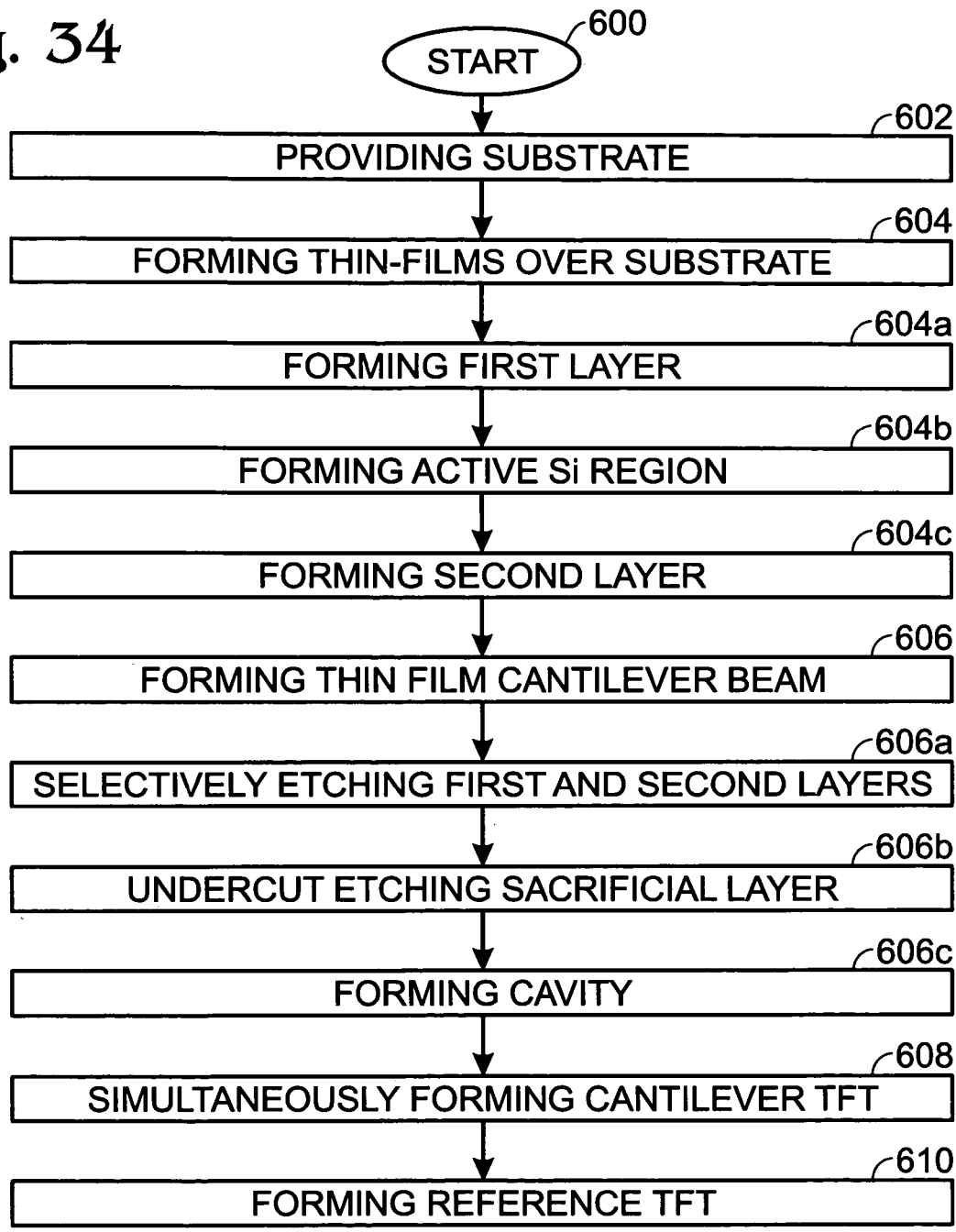
FIG. 34 is a flowchart illustrating a method for fabricating a piezo-TFT cantilever MEMS.

FIG. 34 is a flowchart illustrating a method for fabricating a piezo-TFT cantilever MEMS. Although the method is depicted as a sequence of numbered steps for clarity, no order should be inferred from the numbering unless explicitly stated. It should be understood that some of these steps may be skipped, performed in parallel, or performed without the requirement of maintaining a strict order of sequence. The method starts at Step 600.

Step 602 provides a substrate, which may be a material such as glass, polymer, quartz, metal foil, Si, sapphire, ceramic, or compound semiconductor materials. Step 604 forms thin-films overlying the substrate. Generally, the thin-films may include a-Si, poly-Si, oxides, a-SiGe, poly-SiGe, metals, metal-containing compounds, nitrides, polymers, ceramic films, magnetic films, or compound semiconductor materials. However, the method is not limited to any particular materials. Step 606 forms a thin-film cantilever beam. Step 608 simultaneously (with Step 606) forms a TFT within the cantilever beam. By "simultaneously" it is meant that the cantilever beam and TFT are both formed by thin-film processes. Further, some processes steps may be performed simultaneously for both the fabrication of the cantilever beam and the TFT.

As noted above in the discussion of FIGS. 1 and 2, simultaneously forming the TFT within the cantilever beam (Step 608) includes forming a TFT in a location such as at least partially overlying a cantilever beam top surface, at least partially overlying a cantilever beam bottom surface, or embedded within the cantilever beam.

In the simplest form, Step 604 selectively forms a Si layer overlying the substrate. Then Steps 606 and Step 608 form the cantilever beam and the cantilever TFT, respectively, from the layer. For example, the cantilever beam is formed from a-Si, with a poly-Si TFT active region being a part of the Si layer. Otherwise, the cantilever beam structure is made from multiple layers.

In one aspect, forming thin-films on the substrate in Step 604 includes substeps. Step 604a selectively forms a first layer with a first stress level. Step 604b selectively forms a first active Si region overlying the first layer. Step 604c selectively forms a second layer with a second stress level overlying the first layer. The first and second layers may be formed from a material such as Si, Si nitride, or Si oxide. Then, Step 606 forms a thin-film cantilever beam from the first and second layers, and Step 608 forms TFT source/drain (S/D) and channel regions from the first active Si region.

Steps 606 and 608 may both include a step of laser annealing, as this a possible thin-film process step. Thus, simultaneously forming the TFT within the cantilever in Step 608 may include creating an electrical characteristic in the active Si region in response to the laser annealing, while forming a thin-film cantilever beam in Step 606 includes creating a mechanical characteristic in the second layer in response to the laser annealing. In some aspects, the laser annealing associated with Steps 606 and 608 may be carried out in the same process step, although the two annealing conditions need not be identical. Alternately, the annealing is performed in different process steps.

In another aspect Step 604 selectively forms a sacrificial layer overlying the substrate. Then, forming the thin-film cantilever beam in Step 606 includes substeps. Step 606a selectively etches the first and second layers, exposing the sacrificial layer. Step 606b undercut etches the sacrificial layer. Step 606c forms a cavity between the first layer and the substrate. Note, in some aspects an insulator or other material layer may separate the substrate from the first layer. These intervening layers may, or may not be etched, depending on design goals and specific materials. The sacrificial layer material can be AlN, Si, SiGe, polymers, dielectrics, or ceramics.

In a different aspect, simultaneously forming the TFT within the cantilever beam (Step 608) includes forming a cantilever strain-sensing TFT. Then, Step 610 simultaneously forms a strain-reference TFT overlying the substrate, adjacent the cantilever. More specifically, forming thin-films overlying the substrate in Step 604 includes forming a second active Si region adjacent the cantilever, simultaneously with forming the first active Si region. Then, simultaneously forming the cantilever TFT and reference TFT (Step 608 and 610) includes laser annealing the first and second active Si regions in the same process step. Alternately, Step 610 may simultaneously form a strain-reference TFT overlying a region of unetched sacrificial layer, adjacent the cantilever.

Figure 35:
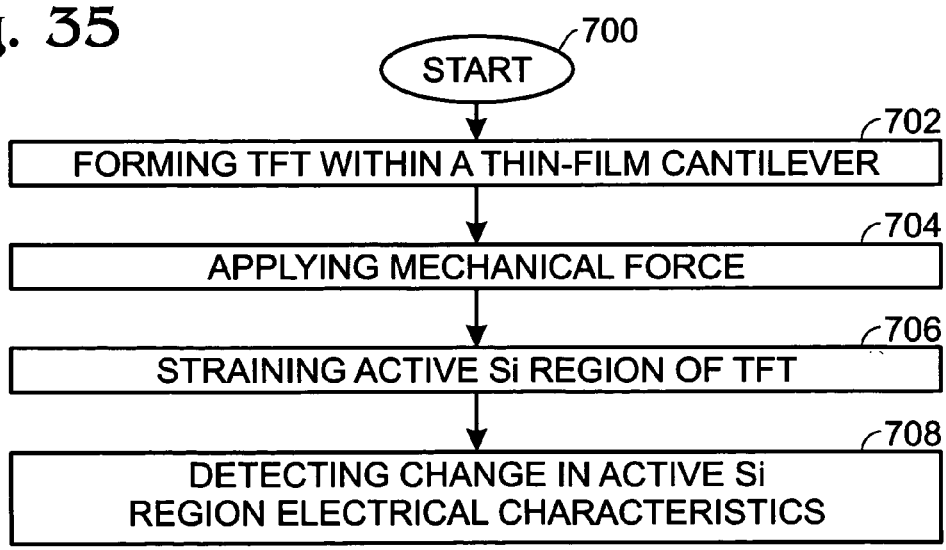
FIG. 35 is a flowchart illustrating a method for detecting strain in a thin-film cantilever.

FIG. 35 is a flowchart illustrating a method for detecting strain in a thin-film cantilever. The method starts at Step 700. Step 702 forms a TFT within a thin-film cantilever beam. Step 704 applies a mechanical force to the cantilever beam.

The mechanical force can be a temperature, chemical reaction, vibration, or audio frequency to name a few examples. A used herein, a "mechanical force" is any event of circumstance that induces a stress or strain upon the cantilever. Step 706, in response to the mechanical force, changes the strain in an active Si region of the TFT. Step 708 detects a change in active Si region electrical characteristics.

In one aspect, forming a TFT within a thin-film cantilever beam in Step 702 includes forming the TFT and cantilever beam using the same TFT processes. For example, the TFT and cantilever beam may be made from the same materials. In another aspect, the TFT and cantilever beam are formed using laser annealing processes. For example, the TFT and cantilever beam can both be formed as a result of the same laser annealing process step. However, the laser annealing may not be precisely simultaneous, as some laser annealing processes involve laser shot sequences and iterations.

In a different aspect, Step 702 alters the electrical properties of the TFT, and the mechanical properties of the cantilever beam, in response to the laser annealing. Then, the strain change in the active Si region of the TFT that occurs in Step 706 is at least partially responsive to the altered mechanical properties. Likewise, detecting the change in active Si region electrical characteristics in Step 708 is at least partially responsive to the altered electrical properties.

A piezo-TFT cantilever MEMS and associated fabrication processes have been provided. Examples of various materials, dimensions, designs, and process flows have been given to help illustrate the invention. However, the invention is not limited to merely these examples. Other variations and embodiments of the invention will occur to those skilled in the art.

We claim:

1. A piezo thin-film transistor (piezo-TFT) cantilever microelectromechanical system (MEMS), the piezo-TFT cantilever comprising:
   a substrate;
   a thin-film cantilever beam having a distal end, anchored to the substrate, and a proximal end;
   a TFG within the cantilever beam;
   wherein the cantilever beam includes:
   a first thin-film layer with a first stress level; and
   a second thin-film layer with a second stress level overlying the first layer.

2. The piezo-TFT cantilever of claim 1 wherein the cantilever beam has a top surface and a bottom surface; and
   wherein the cantilever TFT has a location selected from the group including at least partially on the cantilever beam top surface, at least partially on the cantilever beam bottom surface, and embedded within the cantilever beam.

3. The piezo-TFT cantilever of claim 1 wherein the cantilever beam and TFT are made from materials selected from the group including amorphous silicon (a-Si), polycrystalline Si (poly-Si), oxides, a-SiGe, poly-SiGe, metals, metal-containing compounds, nitrides, polymers, ceramic films, magnetic films, and compound semiconductor materials.

4. The piezo-TFT cantilever of claim 1 wherein the substrate is a material selected from the group including glass, polymer, quartz, metal foil, Si, sapphire, ceramic, and compound semiconductor materials.

5. The piezo-TFT cantilever of claim 1 further comprising:
   a temporary sacrificial layer overlying the substrate; and
   a cavity formed between the first layer and the substrate in response to removing the temporary sacrificial layer.

6. The piezo-TFT cantilever of claim 5 wherein the temporary sacrificial layer is a material selected from the group including AlN, Si, SiGe, polymers, dielectrics, and ceramics.

7. The piezo-TFT cantilever of claim 1 wherein the first and second layers are a material selected from the group including Si, Si nitride, and Si oxide.

8. The piezo-TFT cantilever of claim 1 wherein cantilever TFT is a cantilever strain-sensing TFT; and
   the piezo-TFT cantilever further comprising:
   a strain-reference TFT overlying the substrate and adjacent the cantilever beam.

9. The piezo-TFT cantilever of claim 1 wherein the cantilever TFT includes a channel region and source/drain regions formed in an active Si region; and
   wherein the TFT active Si region is part of a cantilever beam Si layer.

10. The piezo-TFT cantilever of claim 1 wherein the cantilever TFT includes a channel region and source/drain regions formed in an active Si region; and
    wherein the TFT active Si region and the cantilever beam include laser annealed materials.

11. The piezo-TFT cantilever of claim 1 further comprising:
    a strain-reference TFT;
    a sacrificial layer overlying the substrate with temporary regions and permanent regions; and
    a cavity formed between the first layer and the substrate in response to removing the temporary sacrificial layer;
    wherein the cantilever TFT is a strain-sensing TFT that overlies the cavity; and
    wherein the strain-reference TFT overlies the permanent region of sacrificial layer.

* * * * *